(12) United States Patent
Ochi et al.

(10) Patent No.: US 9,660,103 B2
(45) Date of Patent: May 23, 2017

(54) THIN FILM TRANSISTOR AND METHOD FOR MANUFACTURING SAME

(71) Applicant: KABUSHIKI KAISHA KOBE SEIKO SHO (KOBE STEEL, LTD.), Kobe-shi (JP)

(72) Inventors: Mototaka Ochi, Kobe (JP); Shinya Morita, Kobe (JP); Yasuyuki Takanashi, Kobe (JP); Hiroshi Goto, Kobe (JP); Toshihiro Kugimiya, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/888,213

(22) PCT Filed: Jun. 24, 2014

(86) PCT No.: PCT/JP2014/066620
§ 371 (c)(1),
(2) Date: Oct. 30, 2015

(87) PCT Pub. No.: WO2014/208520
PCT Pub. Date: Dec. 31, 2014

(65) Prior Publication Data
US 2016/0079437 A1    Mar. 17, 2016

(30) Foreign Application Priority Data

Jun. 28, 2013  (JP) ................................ 2013-137294
Apr. 11, 2014  (JP) ................................ 2014-082143

(51) Int. Cl.
*H01L 29/786* (2006.01)
*H01L 27/12* (2006.01)
(Continued)

(52) U.S. Cl.
CPC ...... *H01L 29/78693* (2013.01); *H01L 21/477* (2013.01); *H01L 27/1214* (2013.01);
(Continued)

(58) Field of Classification Search
CPC .......... H01L 29/78693; H01L 29/7869; H01L 27/1214; H01L 27/1225; H01L 27/1222
See application file for complete search history.

(56) References Cited

U.S. PATENT DOCUMENTS 7,391,055 B1    6/2008  Murakami et al.
2005/0156174 A1  7/2005  Murakami et al.
(Continued)

FOREIGN PATENT DOCUMENTS

JP    2001-36019 A    2/2001
JP    2009-141002     6/2009
(Continued)

OTHER PUBLICATIONS

International Search Report and Written Opinion of the International Searching Authority Issued Sep. 22, 2014 in PCT/JP2014/066620 Filed Jun. 24, 2014.

*Primary Examiner* — Thanhha Pham
(74) *Attorney, Agent, or Firm* — Oblon, McClelland, Maier & Neustadt, L.L.P.

(57) ABSTRACT

This thin film transistor comprises, on a substrate, at least a gate electrode, a gate insulating film, an oxide semiconductor layer, a source-drain electrode, and two or more protective films. The oxide semiconductor layer comprises Sn, O and one or more elements selected from the group consisting of In, Ga and Zn. In addition, the two or more protective films are composed of at least a first protective film that is in contact with the oxide semiconductor film, and one or more second protective films other than the first protective film. The first protective film is a $SiO_x$ film having a hydrogen concentration of 3.5 atomic % or lower.

19 Claims, 16 Drawing Sheets

(51) Int. Cl.
*H01L 21/477* (2006.01)
*H01L 29/24* (2006.01)
*H01L 29/66* (2006.01)

(52) U.S. Cl.
CPC ...... *H01L 27/1222* (2013.01); *H01L 27/1225* (2013.01); *H01L 29/247* (2013.01); *H01L 29/66969* (2013.01); *H01L 29/7869* (2013.01); *H01L 29/78606* (2013.01); *H01L 29/78696* (2013.01)

(56) References Cited

U.S. PATENT DOCUMENTS

| | | |
|---|---|---|
| 2008/0174710 A1 | 7/2008 | Murakami et al. |
| 2010/0283049 A1 | 11/2010 | Sato et al. |
| 2011/0068336 A1 | 3/2011 | Yamazaki et al. |
| 2011/0124153 A1* | 5/2011 | Hosoba ............ H01L 21/02554 438/104 |
| 2012/0001168 A1 | 1/2012 | Ichijo et al. |
| 2012/0273770 A1 | 11/2012 | Sunagawa et al. |
| 2013/0009111 A1 | 1/2013 | Morita et al. |
| 2013/0240802 A1 | 9/2013 | Miki et al. |
| 2014/0061631 A1* | 3/2014 | Lee .................. H01L 29/66969 257/43 |

FOREIGN PATENT DOCUMENTS

| | | |
|---|---|---|
| JP | 2011-091381 | 5/2011 |
| JP | 2012-033913 | 2/2012 |
| JP | 2012-124446 | 6/2012 |
| JP | 2013-070010 | 4/2013 |
| TW | 454230 B | 9/2001 |
| TW | 200941724 A | 10/2009 |
| TW | 201129545 A1 | 9/2011 |
| WO | WO 2011/074232 A1 | 6/2011 |

* cited by examiner

FIG. 1A
FIG. 1B
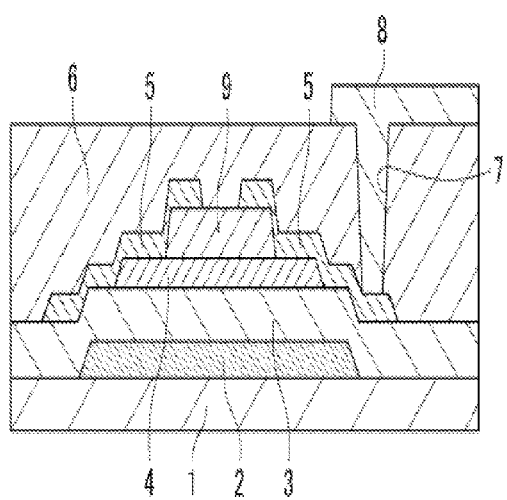
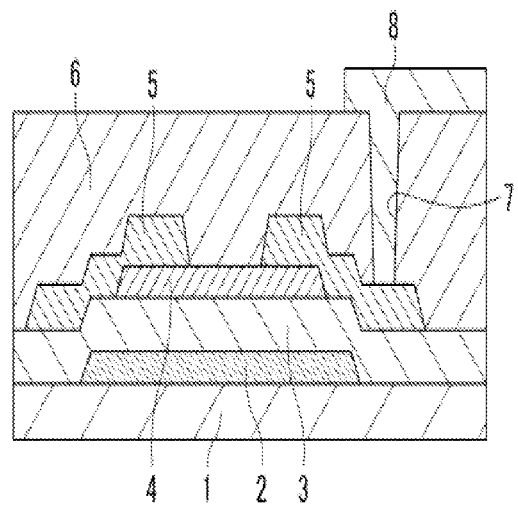

FIG. 4A
FIG. 4B
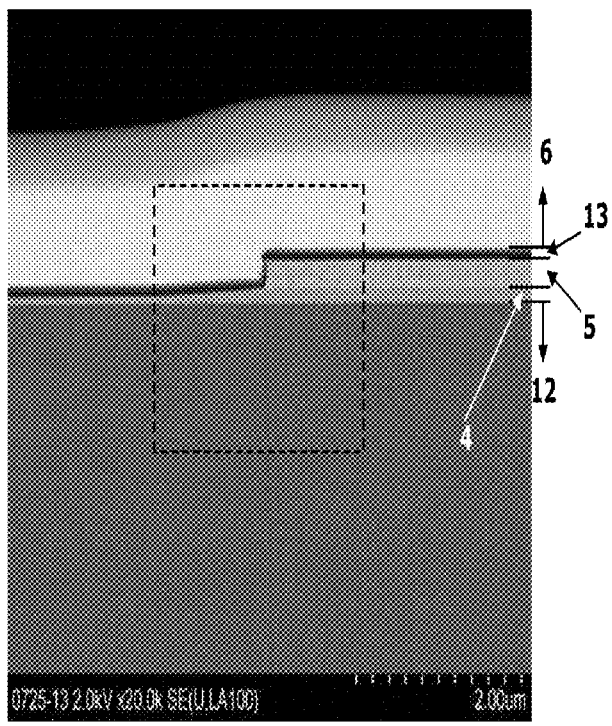
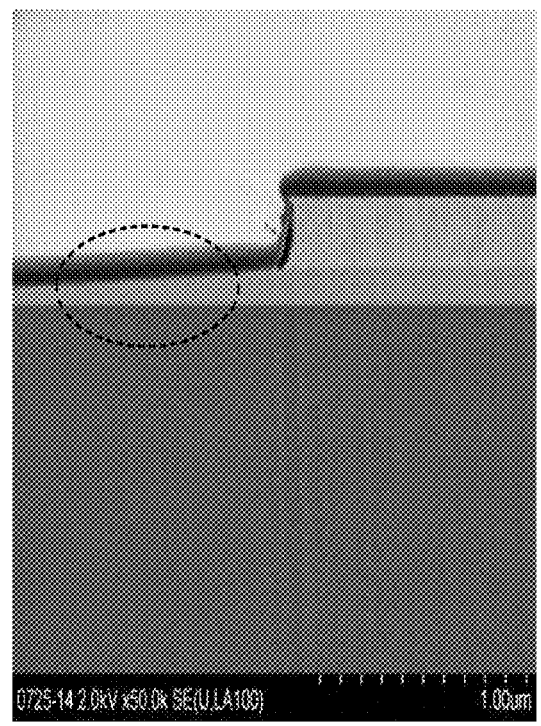

FIG. 11A
FIG. 11B
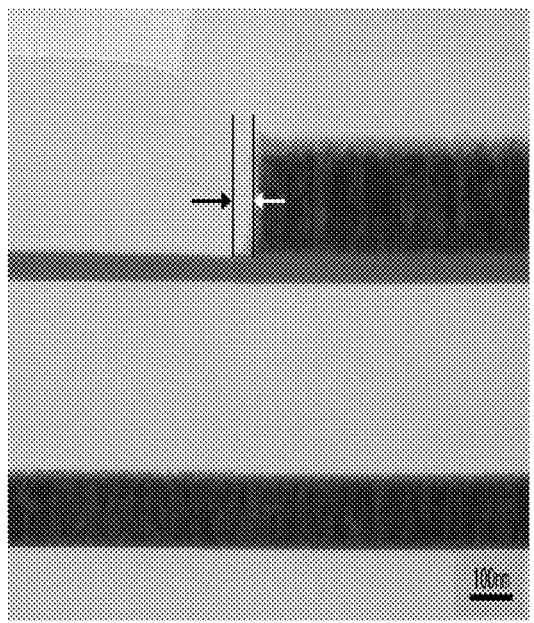
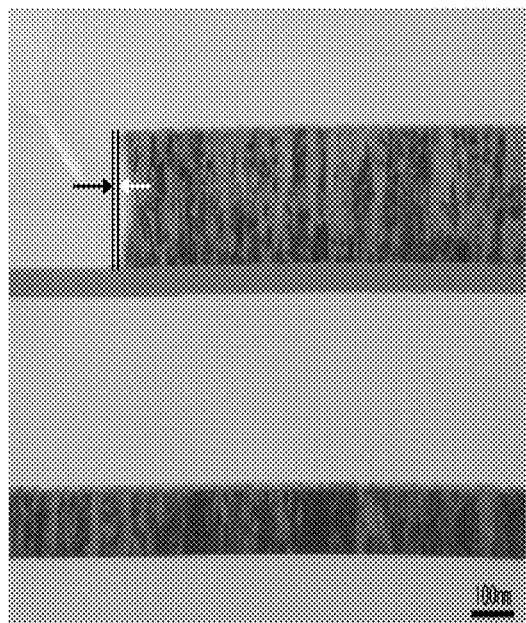

| μSAT (cm²/Vs) | 6.05 |
|---|---|
| Vth (V) | -2.50 |
| SS (V/dec) | 0.25 |

LNBTS: $\Delta V_{th}$=3.25V

| μSAT (cm²/Vs) | 6.97 |
| --- | --- |
| Vth (V) | -1.25 |
| SS (V/dec) | 0.28 |

LNBTS: ΔV$_{th}$=1.75V

Mobility : 9.91 (cm$^2$/Vs)
$V_{th}$ : 1.75 (V)
SS : 0.27 (V/decade)
$|\Delta V_{th}|$ : 1.75 V

THIN FILM TRANSISTOR AND METHOD FOR MANUFACTURING SAME

TECHNICAL FIELD

The present invention relates to a thin film transistor to be used in display devices such as liquid crystal displays and organic EL displays; and a manufacturing method of the thin-film transistor. A thin film transistor is occasionally referred to as TFT hereinbelow.

BACKGROUND ART

As compared with widely used amorphous silicon (a-Si), amorphous (non-crystalline) oxide semiconductors have high carrier mobilities, wide optical band gaps, and film formability at low temperatures, and therefore, have highly been expected to be applied for; next generation displays which are required to have large sizes, high resolution, and high-speed drives; resin substrates having low heat resistance; and others. The carrier mobility is also called as "field-effect mobility" which may hereinafter be referred to simply as "mobility".

Among the oxide semiconductors, an amorphous oxide semiconductor consisting of indium, gallium, zinc, and oxygen, and an amorphous oxide semiconductor consisting of indium, zinc, tin, and oxygen have been used because of their high carrier mobilities. The amorphous oxide semiconductor consisting of indium, gallium, zinc, and oxygen is occasionally referred to as "In—Ga—Zn—O" or "IGZO"

There are two types in thin film transistors of bottom-gate structure comprising an oxide semiconductor; one is an etch stop type with an etch stopper layer 9 as shown in FIG. 1A, while the other is a back channel etch type without an etch stopper layer as shown in FIG. 1B. Hereinbelow, the etch stop type and the back channel etch type are referred to as "ESL (Etch Stop Layer) type" and "BCE (Back Channel Etch) type", respectively.

The BCE type TFT, without an etch stopper layer, depicted in FIG. 1B is superior in terms of productivity because formation of an etch stopper layer is not necessary in its fabrication process. The BCE type TFT may have a structure depicted in FIG. 2 in which a passivation layer 6 in FIG. 1B is a double layer.

There is a problem, however, in the fabrication process of the BCE type TFT as described in the following. A wet etchant for example an acid-based etching solution including phosphoric acid, nitric acid, and acetic acid, is used for patternining a source-drain electrode formed on top of the oxide semiconductor layer. A surface of the oxide semiconductor layer being subjected to the wet etchant is etched or damaged so that the TFT characteristics of the oxide semiconductor may be deteriorated.

An oxide semiconductor consisting of aforementioned IGZO, for example, shows an high solubility to inorganic acid-based wet etchants which are used to wet etch source-drain electrodes, and is extremely easily etched by the inorganic acid-based wet etchant solutions. If the IGZO film is dissolved in the wet etching process of the source-drain electrode, fabrication of TFT then becomes difficult, and the TFT characteristics are deteriorated. Hereinbelow, etching by using an acid-based wet etchants is occasionally referred to as "acid etching" or "wet etching".

In an attempt to suppress the damage to the oxide semiconductor layer of the BCE-type TFT, for example, technologies of Patent Documents 1 to 3 listed below have been proposed. These prior arts propose to suppress the damage to the oxide semiconductor layer by forming a sacrificial layer or a recessed part between an oxide semiconductor layer and a source-drain electrode. It is necessary, however, to increase numbers of processing steps in order to form such a sacrificial layer or a recessed part. Further, the non-patent Literature Document 1 discloses removing a damaged layer from the surface of the oxide semiconductor layer. It is difficult, however, to uniformly remove such a damaged layer.

DESCRIPTION OF THE RELATED ART

Patent Document

Patent Document 1: Japanese Patent Laid-open Publication No. 2012-146956
Patent Document 2: Japanese Patent Laid-open Publication No. 2011-54812
Patent Document 3: Japanese Patent Laid-open Publication No. 2009-4787

Non-Patent Literature Document

Non-patent Literature Document 1: C.-J. Kim et al., Electrochem. Solid-State Lett., 12 (4), H95-H97 (2009)

SUMMARY OF THE INVENTION

Problems to be Solved by the Invention

The present invention has been made under the circumstances described above, and one object of the present invention is to provide a BCE type TFT, without an etch stopper layer, having; high field-effect mobility; excellent switching properties represented particularly by a low S value; and excellent stability to stresses, which is represented by a small variation in the threshold voltage after applying the light stress or the like. In particular, such a TFT has the excellent characteristics even when it comprises a Mo-based film as a source-drain electrode. Another object of the present invention is to realize a manufacturing method of the TFT. It is noted here that the stress stability is occasionally referred to as "light stress stability" hereinbelow.

Means for Solving the Problems

One thin film transistor of the present invention, which can solve the above-mentioned problems, is comprising at least; a gate electrode, a gate insulator film, an oxide semiconductor layer, a source-drain electrode, and a passivation film comprising more than one layer on a substrate. The oxide semiconductor layer consists of Sn; one or more kinds of element selected from a group consisting of In, Ga, and Zn; and O. The thin film transistor is further characterized in that the passivation film comprises a first protective film in contact to the oxide semiconductor layer and a second protective film comprising one or more layer other than the first protective film. The first protective film is $SiO_x$ film and hydrogen concentration in the film is 3.5 atomic % or lower.

The second protective film is preferably an insulating compound film or a laminate film comprising a resin film and the insulating compound film.

The insulating compound film is preferably an oxide, a nitride, or an oxynitride film comprising one or more kinds of element selected from a group consisting Si, Al, Ti, Ta, Ce, Ga, Hf, Nb, V, W, Y, and Zr.

The insulating compound film is preferably one film or more of a SiN$_x$ film and an oxide film comprising one or more kinds of element selected from a group consisting Si, Al, Ti, Ta, Ce, Ga, Hf, Nb, V, W, Y, and Zr.

Specific resistance of the oxide semiconductor layer is preferably within a range from $2.1 \times 10^2$ Ω-cm or larger to $1.0 \times 10^5$ Ω-cm or smaller.

The oxide semiconductor layer preferably comprises Sn in an amount of 9 atomic % or higher and 50 atomic % or lower relative to the total amount of all the metal elements in the oxide semiconductor layer. In particular, the oxide semiconductor layer is preferably composed of In, Ga, Zn, Sn, and O, wherein the contents of respective metal elements relative to the total amount of In, Ga, Zn, and Sn; In: larger than or equal to 15 atomic % and smaller than or equal to 25 atomic %; Ga: larger than or equal to 5 atomic % and smaller than or equal to 20 atomic %; Zn: larger than or equal to 40 atomic % and smaller than or equal to 60 atomic %; and Sn: larger than or equal to 9 atomic % and smaller than or equal to 25 atomic %.

Thickness of the SiO$_x$ film is preferably larger than or equal to 30 nm.

One or more kinds of film selected from a pure Mo film and a Mo alloy film may be formed as the source-drain electrode.

The source-drain electrode may be a laminate film comprising one or more of a pure Mo film and a Mo alloy film as well as one or more kinds of film selected from a group consisting a pure Al film, a pure Cu film, an Al alloy film, and a Cu alloy film. The laminate film may be formed so that the one or more of a pure Mo film and a Mo alloy film is in direct contact to the oxide semiconductor layer.

The manufacturing method of the thin film transistor according to the present invention which can solve the problem is a manufacturing method the thin film transistor and characterized in that the patterning of the source-drain electrode is carried out by using an acid-based etchant solution and in that an oxidation treatment is subsequently carried out after forming a SiO$_x$ film as the first protective film, and in that the second protective film is then formed on the first protective film.

It is preferable to carry out a heat treatment at a temperature of higher than or equal to 130° C. and lower than or equal to 400° C. for the oxidation treatment.

It is preferable to carry out an additional heat treatment after forming the second protective film.

Effects of the Invention

The present invention can provide a TFT having an oxide semiconductor layer which is excellent in terms of uniformity in thickness by containing Sn even if it is subjected to an acid-based etchant solution for forming a source-drain electrode in the course of the manufacturing process of the BCE-type TFT.

Further, even if the Mo-based film, that is, one or more of a pure Mo film and a Mo alloy film is used for the source-drain electrode; and an acid-based etchant solution is used for patterning the source-drain electrode, oxidation at an end of the source-drain electrode consisting of the Mo-based film can be suppressed in the BCE-type TFT according to the present invention. The present invention can thus provide a BCE-type TFT which is excellent in terms of static characteristics, particularly in terms of switching characteristics, and even particularly in terms of suppression of S value, and state of the surface of the oxide semiconductor layer, as well as the light stress stability.

According to the method of the present invention, conversion of a transistor to a conductor, increase of off-current, or variation of V$_{th}$ toward the negative side can be prevented because excessive diffusion of hydrogen from the SiO$_x$ film to the oxide semiconductor layer is not induced in the course of the specified oxidation treatment. According to the method of the present invention, conversion of a transistor to a conductor, increase of off-current, or variation of V$_{th}$ toward the negative side can be prevented because diffusion of hydrogen from the SiN$_x$ film containing a large amount of hydrogen to the oxide semiconductor layer does not occur.

According to the method of the present invention, a display device having excellent characteristics can be easily attained at low cost because the source-drain electrode may be formed by way of a wet etching process.

Further, number of mask formation processes is small in the course of the manufacturing process of the TFT and the manufacturing cost can be sufficiently reduced because the TFT manufactured by the method according to the present invention does not comprise an etch stopper layer as explained above. Furthermore, because a BCE-type TFT does not have an area where an etch stopper layer and a source-drain electrode overlap with each other as in an ESL-type TFT, the BCE-type TFT can be made smaller in size as compared to the ESL-type TFT.

BRIEF DESCRIPTION OF DRAWINGS

FIG. 1A is a schematic cross-sectional view for explaining a conventional ESL-type thin film transistor.

FIG. 1B is a schematic cross-sectional view for explaining a BCE-type thin film transistor of the present invention.

FIG. 4A is a FE-SEM picture of a TFT in which Sn is not contained in an oxide semiconductor layer.

FIG. 4B is a magnified view of an area indicated by a frame with broken lines in FIG. 4A.

FIG. 11A is a FE-SEM (Field Emission Scanning Electron Microscope) picture of No. 2 TFT in Table 1.

FIG. 11B is a FE-SEM picture of No. 7 TFT in Table 1.

MODE FOR CARRYING OUT THE INVENTION

The present inventors carried out intensive studies in order to solve the problem regarding a BCE-type TFT and completed the invention by finding that the desired object is effectively accomplished by;

including Sn in the oxide semiconductor layer which is subjected to an acid-based etchant solution in the course of forming a source-drain electrode; and carrying out an oxidation treatment after the formation of the source-drain electrode (i.e., after the acid etching) and then forming a $SiO_x$ film as a first protective film, and being subjected to an oxidation treatment to control hydrogen concentration in the $SiO_x$ first protective film to 3.5 atomic % or lower; followed by formation of a second protective film of an insulating compound film or of a laminate film comprising a resin film and an insulating compound film in the course of manufacturing the TFT;

to successfully remove contaminants and damages caused by the wet acid etching without deteriorating static characteristics and hence to obtain a TFT having the oxide semiconductor layer of uniform thickness as well as excellent static characteristics and stress stability even if a Mo-based film is used for the source-drain electrode.

Firstly, compositions and the structure of the oxide semiconductor layer of the present invention are explained.

The oxide semiconductor according to the present invention is characterized in that it comprises Sn as an essential component. Due to the presence of Sn, it is possible to suppress etching of the oxide semiconductor layer by an acid-based etchant solution, and to maintain the surface smoothness of the oxide semiconductor layer as demonstrated in the following evaluation.

[Evaluation of Resistance to Acid-Based Etchant Solution]

Resistance of the oxide semiconductor layer to an acid-based etchant solution used in the course of forming the source-drain electrode was evaluated. An influence of presence/absence of Sn the oxide semiconductor layer on the resistance was studied.

Specifically, a TFT having an oxide semiconductor layer in which metal elements were consisted of In, Ga, Zn, and Sn, and contents of respective metal elements other than Sn relative to the total amount of In, Ga, Zn, and Sn were within preferred ranges described below was fabricated as a TFT with a Sn-containing oxide semiconductor layer. A TFT having an oxide semiconductor layer consisting IGZO wherein In:Ga:Zn=1:1:1 in atomic ratio was also fabricated as a TFT with a Sn-free oxide semiconductor layer. In the course of fabrication for both types of the TFTs, the source-drain electrodes were patterned by using a PAN acid-based etchant solution as described in examples in the following. In this evaluation, the TFTs were not subjected to an oxidation treatment explained in the following so as to confirm an influence of the presence/absence of Sn on the chemical resistance. Also, the passivation film was made to a single layer.

Figure 3A:
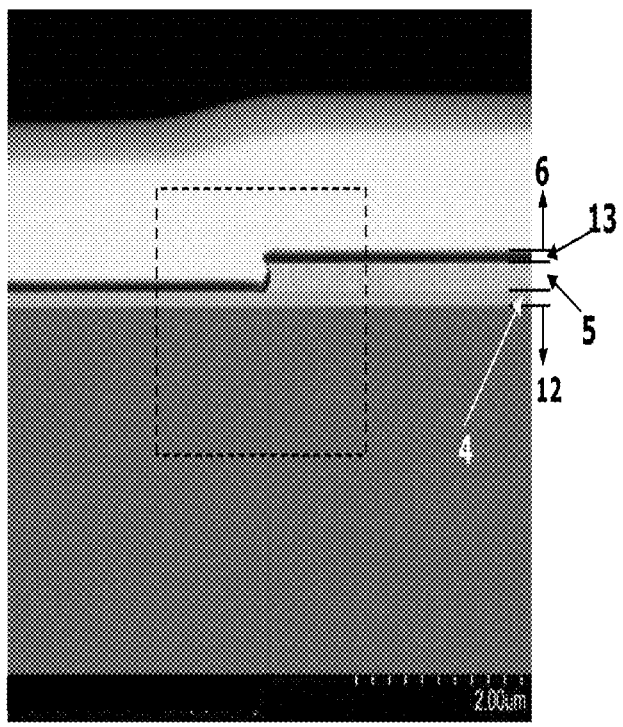
FIG. 3A is a FE-SEM (Field Emission Scanning Electron Microscope) picture of a TFT in which Sn is contained in an oxide semiconductor layer.
Figure 3B:
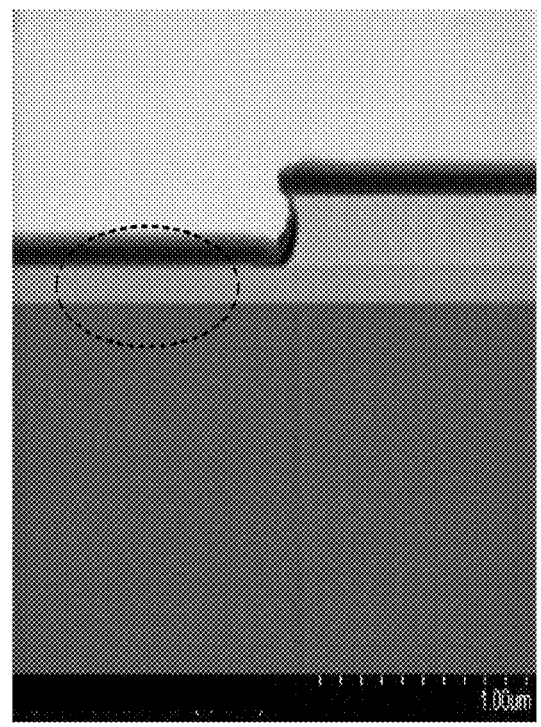
FIG. 3B is a magnified view of an area indicated by a frame with broken lines in FIG. 3A.

A cross section in the lamination direction of each of the obtained TFT was observed by FE-SEM. The pictures of a TFT having an oxide semiconductor layer comprising Sn; and a TFT having an oxide semiconductor layer without Sn; are shown in FIGS. 3A and 3B; and FIGS. 4A and 4B; respectively. As shown in FIGS. 3A and 3B as well as FIGS. 4A and 4B, the TFT used for the evaluation was constituted of an oxide semiconductor layer 4, a source-drain electrode 5, an evaporated carbon film 13, and a passivation film 6, on a Si substrate 12 in this order. The evaporated carbon film 13 was a protective film formed for the purpose of observing the sample in an electron microscope, and therefore the carbon film is not an constituting element of the TFT of the present invention.

It is found from FIGS. 3A and 3B that thickness of the oxide semiconductor layer 4 was not decreased, that is, film reduction was not observed by the over-etching in the acid-based etchant solution when the oxide semiconductor layer 4 contained Sn. Specifically, difference between the thickness of the oxide semiconductor layer 4 directly below an end of a source-drain electrode 5 and the thickness in the center portion of the oxide semiconductor layer 4 was 0%. A TFT comprising an oxide semiconductor layer 4 of excellent in-plane uniformity was obtained, accordingly. It is noted here that the center portion of the oxide semiconductor layer is represented by a midpoint of the shortest distance between an end of a source electrode and an end of a drain electrode. The center portion was subjected to the acid-based etchant solution.

Difference between the thickness of the oxide semiconductor layer directly below an end of a source-drain electrode and the thickness in the center portion of the oxide semiconductor layer=(100×[the thickness of the oxide semiconductor layer directly below a source-drain electrode end–the thickness in the center portion of the oxide semiconductor layer]/the thickness of the semiconductor layer directly below the source-drain electrode end)    (1)

On the other hand, FIGS. 4A and 4B demonstrate that thickness of the oxide semiconductor layer 4 was reduced by the over-etching in the acid-based etchant solution when the oxide semiconductor layer 4 did not contain Sn. Difference between the thickness of the oxide semiconductor layer 4 directly below an end of a source-drain electrode 5 and the thickness in the center portion of the oxide semiconductor layer 4 was larger than 50% as determined by using the expression (1).

In order to effectively exert the effect to suppressing the thickness reduction of the oxide semiconductor layer by Sn, Sn is to be contained in an amount of preferably 9 atomic % or more, more preferably 15 atomic % or more, and even more preferably 19 atomic % or more. The amount of Sn is a proportion relative to the total amount of all the metal elements in the oxide semiconductor layer. The same holds for each amount of other metal elements hereinbelow. When the oxide semiconductor layer consists of metal elements of In, Ga, Zn, and Sn, the amount of Sn may be determined by 100×Sn/(In+Ga+Zn+Sn).

If the amount of Sn contained in the oxide semiconductor layer is excessively large, on the other hand, there may be a case in which the stress stability is deteriorated and the etching rate to a wet etchant solution for the oxide semiconductor is decreased. Sn is thus to be contained in an amount of preferably 50 atomic % or less, more preferably 30 atomic % or less, even more preferably 28 atomic % or less, and still more preferably 25 atomic % or less.

The oxide semiconductor layer is subjected to an acid-based wet etchant solution in the course of forming the source-drain electrode. However, etching of the oxide semiconductor layer may be suppressed by including Sn in the layer as described above. More specifically, etching rate of the oxide semiconductor layer in an acid-based etchant solution may be decreased to 1 Å/sec or smaller, leading to realization a TFT having a 5% or smaller difference between the thickness of the oxide semiconductor layer directly below an end of a source-drain electrode and the thickness in the center portion of the oxide semiconductor layer as determined by the expression (1). If the etching is not uniform and the difference in the thickness is larger than 5%, in-plane variation in the film thickness is generated in the oxide semiconductor layer. Such in-plane variation is liable to cause deterioration of the S value and the light stress stability. The difference in thicknesses is thus preferably smaller than or equal to 3%, and is most preferably 0%, that is, no difference. Specifically, thickness reduction as determined by the difference between the thickness of the oxide semiconductor layer directly below an end of a source-drain electrode and the thickness in the center portion of the oxide semiconductor layer is preferably smaller than or equal to 10 nm, and is more preferably smaller than or equal to 5 nm, for example.

The oxide semiconductor layer comprises one or more kinds of metal element from a group consisting of In, Ga, and Zn; in addition to Sn. The oxide semiconductor layer may preferably consist of metal elements of In, Ga, Zn, and Sn. In terms of the contents of respective metal elements relative to the total amount of In, Ga, Zn, and Sn, it is preferred that Sn satisfies the above-described range and that In, Ga, and Zn satisfy ranges explained in the following.

Indium is an element effective to reduce electrical resistance of an oxide semiconductor layer. In order to effectively exert the effect, when In is contained in the oxide semiconductor, it is to be contained in an amount, as determined by 100×In/(In+Ga+Zn+Sn), of preferably 15 atomic % or more, more preferably 16 atomic % or more, and even more preferably 17 atomic % or more. On the other hand, if the contained amount of In is excessively large, there may be a case in which the stress stability is deteriorated. Indium is thus to be contained in an amount of preferably 25 atomic % or less, more preferably 23 atomic % or less, and even more preferably 20 atomic % or less.

Gallium is an element effective to suppress generation of oxygen deficiency and improve the stress stability. In order to effectively exert the effect, when Ga is contained in the oxide semiconductor, it is to be contained in an amount, as determined by 100×Ga/(In+Ga+Zn+Sn), of preferably 5 atomic % or more, more preferably 10 atomic % or more, and even more preferably 15 atomic % or more. On the other hand, if the contained amount of Ga is excessively large, there may be a case in which the mobility is decreased due to relative decrease of In and Sn which play a role of conduction path for electrons in the transistor. Ga is thus to be contained in an amount of preferably 20 atomic % or less, more preferably 19 atomic % or less, and even more preferably 18 atomic % or less.

Zinc is an element which influences the wet etching rate and contributes to improving the wet etching properties of the oxide semiconductor layer. Zinc is also an effective element to make amorphous structure of the oxide semiconductor stable and to secure stable and good switching operation of TFTs. In order to sufficiently exert these effects, when Zn is contained in the oxide semiconductor, it is to be contained in an amount, as determined by 100×Zn/(In+Ga+Zn+Sn), of preferably 40 atomic % or more, more preferably 43 atomic % or more, and even more preferably 45 atomic % or more. If the contained amount of Zn is excessively large, on the other hand, etching rate of such oxide semiconductors excessively increases in wet etchant solutions for processing oxide semiconductors, which makes patterning the oxide semiconductor layers into a desired shape difficult. Further, there may be a case in which the oxide semiconductor thin film is crystallized or the stress stability is deteriorated due to relative decrease of In and Sn. Zinc is thus to be contained in an amount of preferably 60 atomic % or less, more preferably 50 atomic % or less.

Thickness of the oxide semiconductor layer is not particularly limited. The thickness of the oxide semiconductor layer is preferably controlled to greater than or equal to 20 nm, and more preferably greater than or equal to 30 nm. On the other hand, the thickness of the oxide semiconductor layer is preferably smaller than or equal to 200 nm, and more preferably smaller than or equal to 100 nm.

In the present invention, Sn is particularly contained in the oxide semiconductor layer in order to secure the resistance to acid-based etchant solutions used in the process of forming the source-drain electrode as described above. However, that is not enough to satisfactory secure the stress stability as compared to ESL-type TFTs having an etch stopper layer.

The present inventors firstly found that deterioration of the stress stability was caused by damaging the In—Ga—Zn—Sn—O based material, more specifically by oxygen deficiency, in the course of the acid etching for patterning of a source-drain electrode as described in detail in the following. The present inventors then found that it was very effective for recovering the damage to conduct an oxidation treatment as described in detail in the following.

It was also found that, depending on the kind of the source-drain electrode, there may be a case in which upon carrying out an oxidation treatment described above, a surface of the electrode or an end of an etched electrode was oxidized, the static characteristics of TFT were deteriorated, and in particular the S value was liable to increase. It was found that the oxidation was liable to be induced particularly when a Mo-based film was used for the source-drain electrode.

In the present invention, intensive studies were made aiming to improve the stress stability without deteriorating the static characteristics, in particular without increasing the S value even when a Mo-based film was used for the source-drain electrode.

Figure 7:
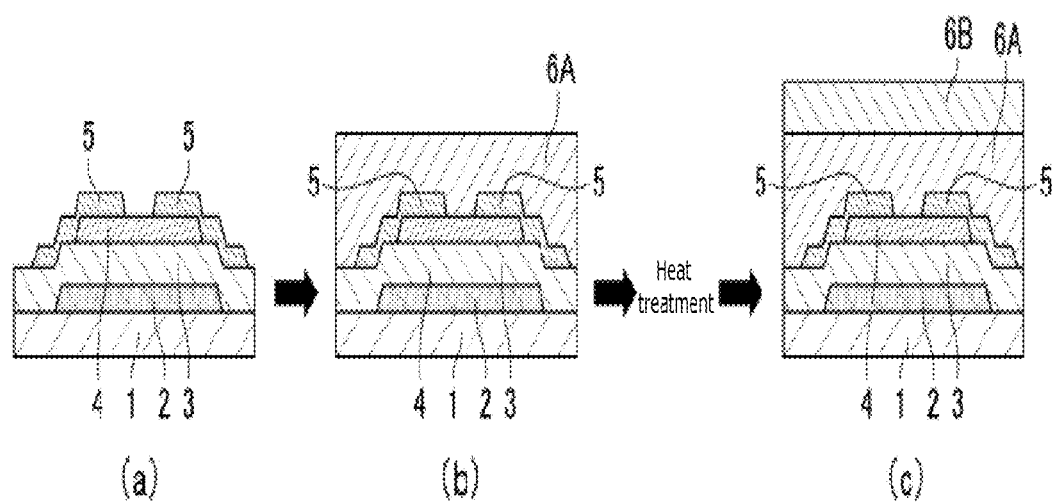
FIG. 7 is a chart for explaining a part of manufacturing process of the TFT according to the present invention.

As a result of the efforts, the followings were found in the present invention. Conventionally, in manufacturing a BCE-type TFT, after patterning a source-drain electrode as illustrated in FIG. 5A, a passivation film PV comprising a $SiO_x$ film as the first protective film 6A and a $SiN_x$ film as the second protective film 6B were formed as illustrated in FIG. 5B, followed by a heat treatment. In the present invention, on the other hand, it was found effective to form a $SiO_x$ film as the first protective film 6A as illustrated in FIG. 7B after patterning a source-drain electrode as illustrated in FIG. 7A, followed by an oxidation treatment (which is a heat treatment in FIG. 7), and then to form an insulating compound film as the second protective film as illustrated in FIG. 7C to complete the passivation film. Hereinbelow, the protective film comprising an insulating compound film is occasionally referred to as the second protective film.

Because an oxidation treatment such as a heat treatment is performed after forming a $SiO_x$ film according to the manufacturing method, the oxidation of an end of the source-drain electrode can be suppressed even in a case in which a easily-oxidized Mo-based film is used for the source-chain electrode. Deterioration of the switching characteristics, particularly increase of the S value, can be circumvented, accordingly. Furthermore, damages caused by an acid-based etchant solution on the surface of the oxide semiconductor layer such as an In—Ga—Zn—Sn—O film can be recovered. Specifically, solid-state oxygen diffusion by way of a heat treatment for depositing a $SiO_x$ film is enhanced, recovery of oxygen deficiencies, in particular, is prompted, and hence the light stress stability may be improved. It was also found to suppress a shift amount of a threshold voltage $V_{th}$, denoted as $\Delta V_{th}$ (unit: V) after sweeping multiple times by preferably carrying out an additional heat treatment after the formation of the second protective film. Hereinbelow, the manufacturing conditions specified in the present invention are explained in detail.

Firstly explained are mechanism and effects of processes carried out in the order of; the formation of $SiO_x$ film (the first protective film), the oxidation treatment, and the formation of the second protective film after patterning the source-drain electrode. Hereinbelow, the formation processes of the protective films and the oxidation treatment process may be collectively referred to as "PV process" occasionally.

Figure 5:
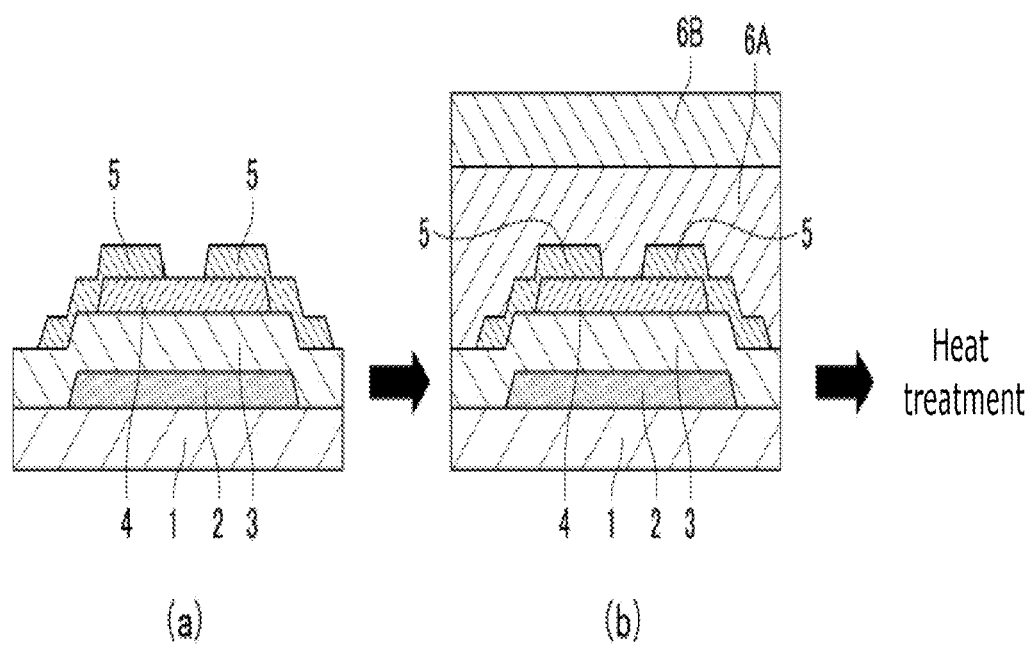
FIG. 5 is a chart for explaining a part of manufacturing process of a conventional TFT.
Figure 6:
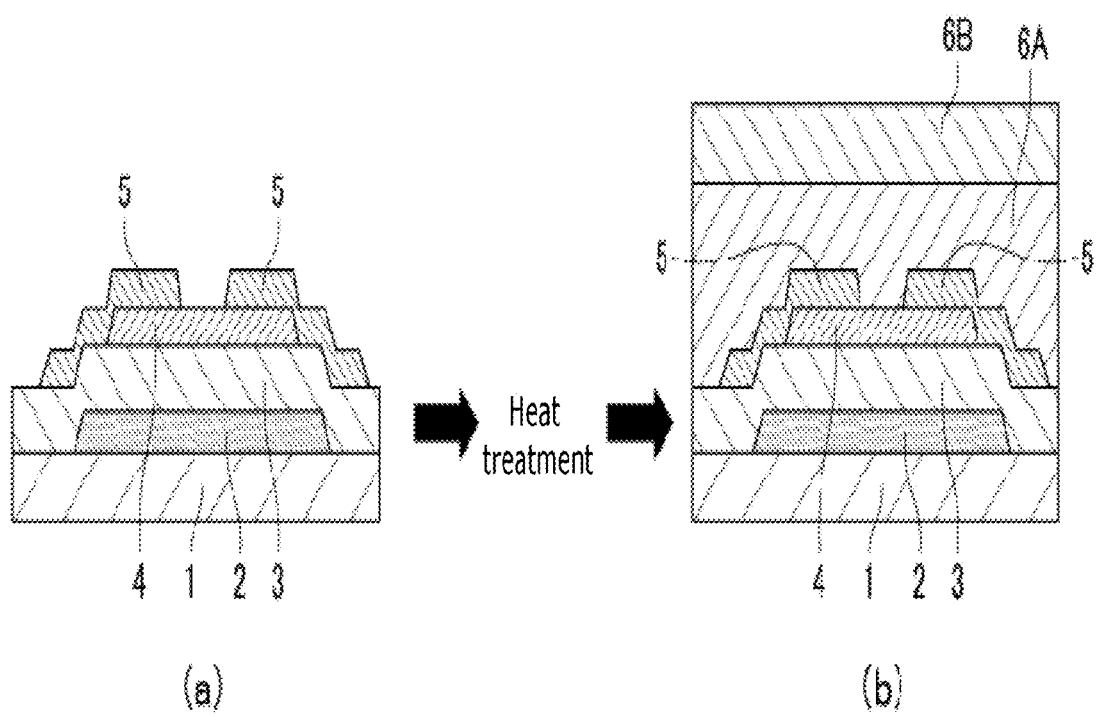
FIG. 6 is a chart for explaining a part of manufacturing process of another conventional TFT.
Figure 8:
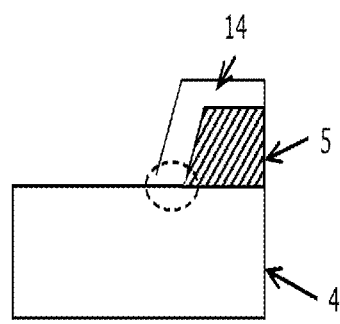
FIG. 8 is a schematic view of a part of a cross-section in the direction of lamination of a TFT. Indicated by a frame with broken lines is an oxide semiconductor layer directly below an oxidiaxed end of a Mo-based film electrode.
Figure 9A:
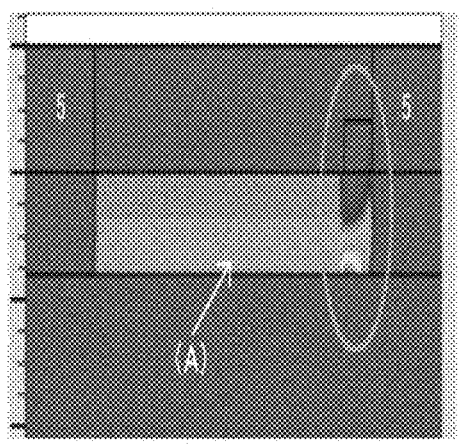
FIG. 9A indicates a current path obtained by a simulation in which tail states of the conduction band is arranged below a side of an end of a source-drain electrode.
Figure 9B:
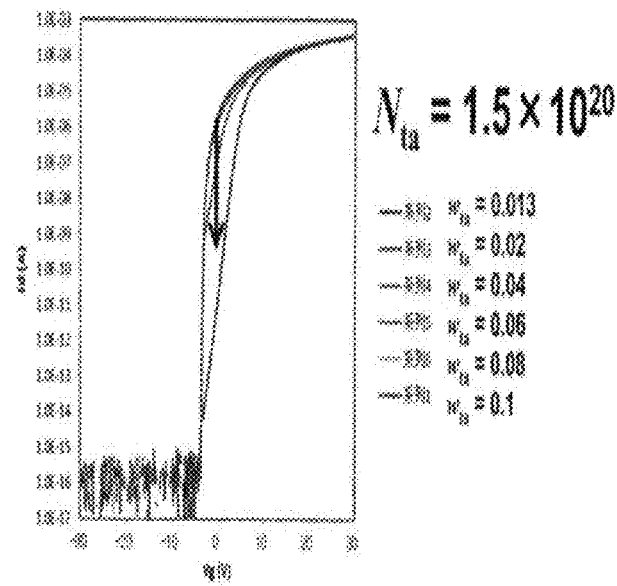
FIG. 9B is a chart for explaining the increase of S value in I$_d$-V$_g$ characteristics which were obtained by a simulation under the configuration indicated in FIG. 9A.

As for process sequence of the formation of the passivation film and the oxidation treatment after patterning the source-drain electrode, there can be a process sequence indicated in FIG. 6 in addition to that indicated in FIG. 5. In the process sequences indicated in FIGS. 5 to 7, a heat treatment is conducted as the oxidation treatment. In the process sequence indicated in FIG. 6, there may be a case in which a surface or an etched end of the source-drain electrode is oxidized in the course of the heat treatment as explained above. In particular, when the electrode is made of a Mo-based film, it is liable to be oxidized. When an end of the electrode material is oxidized in such a manner, acceptor states are formed in the oxide semiconductor layer directly below the oxidized Mo which is considered to deteriorate the switching characteristics. A region surrounded by broken lines in FIG. 8 indicates a part of the oxide semiconductor layer 4 directly below the Mo oxide 14 which is formed on the surface of the source-drain electrode 5 comprising a Mo-based film. FIG. 9A and FIG. 9B depict a result of "acceptor states are formed in the oxide semiconductor layer directly below an oxidized Mo deteriorating the switching characteristics" as described above. FIG. 9A indicates a current path obtained by a simulation in which tail states of the conduction band (acceptor states) is arranged below a side of an end of a source-drain electrode 5 comprising a Mo-based film. FIG. 9B is a graph for explaining the increase of S value in $I_d$-$V_g$ characteristics which were obtained under the configuration indicated in FIG. 9A. In FIG. 9A, a rectangular region A indicates a current density distribution. A region in lighter contrast in a section surrounded by an ellipse indicates where the electric current is hindered.

FIGS. 9A and 9B elucidate the following. When tail states of conduction band (acceptor states) are arranged below a side of an end of a source-drain electrode 5 as illustrated in FIG. 9A, the acceptor states in the region push the conduction band away from the Fermi level. Electrons in the highly defective regions are swept out and accumulated on the side of semiconductor having conducting band at lower energy. As a result, the current density distribution is supposed to change. The acceptor states in the region is supposed to make the current path in switching of the transistor change and the S value increase as illustrated in FIG. 9B. Each of $W_{ta}$ indicated in FIG. 9B in the order of series 2, 3, 4, 5, 6, and 1 from the top represents energy band width of the tail states at the conduction band edge. A larger value of $W_{ta}$ represents higher density of the acceptor states. In FIG. 9B, the energy band width of the tail states are increased in the order of the series 2, 3, 4, 5, 6, and 1, indicating increase of the S value as depicted by decreased of the steepness in the direction of a downward arrow. FIG. 9B thus indicates that the acceptor states are increased by the oxidation of an end of the source-drain electrode, particularly in a case where the source-drain electrode is a Mo-based film, affecting the increase in the S value.

According to the processing order illustrated in FIG. 7 in the present invention, oxidation of the source-drain electrode, particularly at an end of the electrode, and particularly in a case of Mo based film, is suppressed, which suppresses increase of the S value and deterioration of static characteristics of the TFT. Further, the stress stability can be improved by a heat treatment as explained in detail in the following.

By conducting an oxidation treatment after forming a $SiO_x$ film, a surface of the oxide semiconductor is oxidized by solid-phase diffusion of excessive oxygen and hydroxyl group from the $SiO_x$ film, and recovery of oxygen deficiencies is prompted. By the oxidation of the surface of the oxide semiconductor, interface misfit is also reduced between the $SiO_x$ film and the oxide semiconductor layer. It is considered that a heat treatment in an air atmosphere, in particular, contributes introduction of oxygen and hydroxyl group from the environment via the $SiO_x$ film as well.

Further, because diffusion of excessive hydrogen from the $SiO_x$ film to the oxide semiconductor layer does not occur, conversion of the transistor to a conductor, increase of off-current, or variation of $V_{th}$ toward the negative side can be prevented. In addition, a $SiN_x$ film useful for the second protective film generally contains a large amount of hydrogen. However, by forming the $SiN_x$ film after the oxidation treatment as explained above, diffusion of hydrogen from the $SiN_x$ film to the oxide semiconductor layer can be prevented. Conversion of the transistor to a conductor, increase of off-current, or variation of $V_{th}$ toward the negative side can be thus prevented.

Mechanism and effects of the oxidation treatment are explained next.

By the oxidation treatment, the surface of the oxide semiconductor layer, which has been subjected to the acid-based etchant solution and damaged, restore its state before the acid etching. Specifically, during the wet etching for forming the source-drain electrode, the oxide semiconductor layer is reduced and contaminated by C or the like by way of being subjected to the acid-base etchant solution. The reduction and the contaminations such as C are liable to generate oxygen deficiencies which form trap levels and deteriorate the light stress stability. However, by carrying out the oxidation treatment, by which the contaminations are substituted for oxygen or hydroxyl group (OH), the state of the surface prior to the wet etching is thus restored by the oxidation of the oxide semiconductor surface and the removal of C, and excellent stress characteristics, particularly light stress stability can be obtained even in the BCE-type TFT.

As explained below, the present inventors confirmed the above-mentioned mechanism by observing the surface of the oxide semiconductor layer at respective stages of "immediately after forming (as-deposited) the layer," "after the acid etching," and "after the oxidation treatment" by X-ray photoelectron spectroscopy (XPS).

[Surface Analyses of Oxide Semiconductor Layer by XPS]

Surface analyses of the oxide semiconductor layer which was subjected to the acid-based etchant solution were carried out as described below. A heat treatment was conducted as the oxidation treatment in an air ambient at 350° C. for 60 minutes for TFTs used for the surface analyses. The oxide semiconductor layers in the TFTs satisfy the requirements specified in the present invention. For the TFTs used in this evaluation, a passivation film was not formed so as to confirm an influence of the oxidation treatment on the surface properties of the oxide semiconductor layer.

In the course of the TFT fabrication, the O1s spectrum peak was observed by XPS to evaluate each state of the surface of the oxide semiconductor:

(1) immediately after the formation of the (as-deposited) oxide semiconductor;
(2) immediately after being subjected to wet etching process using the acid etchant, specifically the acid etching by using the PAN etchant solution; and
(3) after the oxidation treatment after the wet etching (acid etching) explained in (2).

Figure 10:
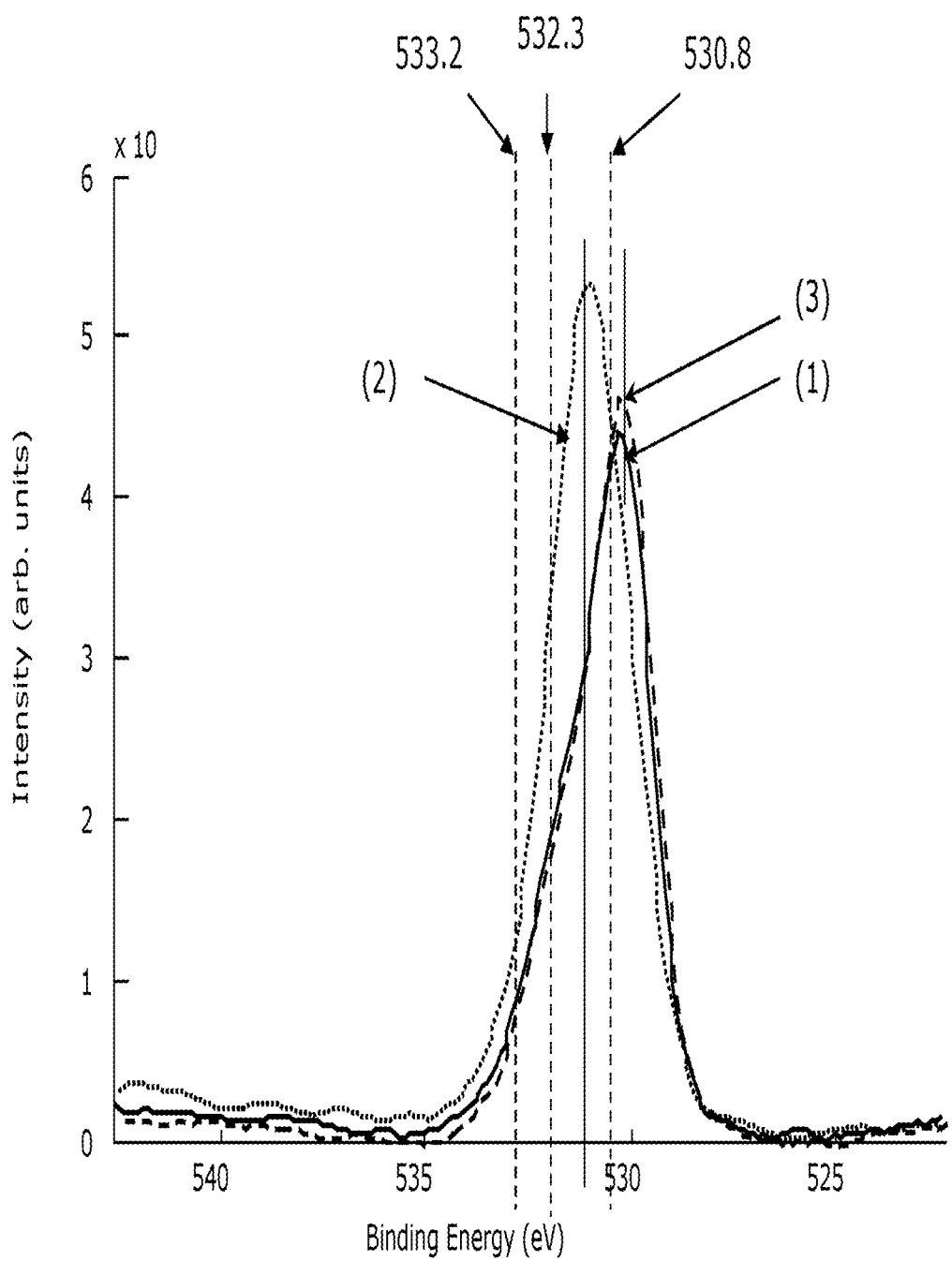
FIG. 10 indicates effects of the wet etching and the oxidation treatment to XPS (X-ray photoelectron spectroscopy) of the oxide semiconductor surface.

These results are collectively shown in FIG. 10. In FIG. 10, dotted vertical lines at 530.8 eV, 532.3 eV, 533.2 eV respectively indicate oxygen deficiency free O1s spectrum peak, O1s spectrum peak with oxygen deficiency, and O1s spectrum peak of OH group.

The results shown in FIG. 10 elucidate the following. By comparing positions of the O1s spectrum peak of (1) the as-deposited surface, that is, immediately after the formation of the oxide semiconductor, (2) the surface after the wet etching, and (3) the surface after the oxidation treatment, the O1s spectrum peak of (1) as-deposited state was at about 530.8 eV while the O1s spectrum peak shifted toward 532.3 eV (with oxygen deficiency) which is on the left side of the as-deposited state after the wet etching (2). Here the O1s spectrum peak after the wet etching (2) corresponds to a conventional manufacturing method of the TFT, in which the as-deposited surface of the oxide semiconductor layer is subjected to the acid etching while the oxidation treatment is not carried out for the surface. However, when the oxidation treatment was conducted after the wet etching, the O1s spectrum peak (3) was at approximately the same position of 530.8 eV (within a range of 530.8±0.5 eV) as the as-deposited surface (1) as indicated in FIG. 10.

From the results indicated in FIG. 10, the effect of the oxidation treatment to the state of the surface was found as follows. The O1s spectrum peak shifted toward left from the as-deposited state in the plot after the wet etching (acid etching). This indicates that by the wet etching contaminants such as C were adsorbed on the surface and bonded to oxygen of metal oxides constituting the oxide semiconductor, forming a state of oxygen deficiency in the oxide semiconductor. By conducting the oxidation treatment such as a heat treatment after the wet etching, however, the contaminants such as C were substituted by oxygen. The as-deposited state was restored as evident in the O1s spectrum shift by removing C which could be electron traps on the surface. Such behavior of the surface was also observed when the $N_2O$ plasma treatment was conducted as the oxidation treatment.

Specific resistance of the oxide semiconductor layer is preferably within a range from $2.1 \times 10^2$ Ω-cm or larger to $1.0 \times 10^5$ Ω-cm or smaller after the oxidation treatment as measured by a method explained later in an example. By controlling the specific resistance of the oxide semiconductor layer to the range, it becomes possible to secure the excellent light stress stability as well as the excellent static characteristics, particularly low S value as explained later in an example. The specific resistance is more preferably larger than or equal to $4 \times 10^2$ Ω-cm. The specific resistance is preferably $4.0 \times 10^4$ Ω-cm or smaller, more preferably $9.0 \times 10^3$ Ω-cm or smaller, and even more preferably $7.0 \times 10^3$ Ω-cm or smaller.

It was also found by the present inventors who investigated the $SiO_x$ film before and after the oxidation treatment that hydrogen content in the film was decreased to 3.5 atomic % or smaller after the oxidation treatment. The lower the hydrogen content in the $SiO_x$ film after the oxidation treatment, the lower the hydrogen content in the oxide semiconductor layer which is in contact to the $SiO_x$ film, which improves the light stress stability. The hydrogen content is preferably smaller than or equal to 3.4 atomic %, and more preferably smaller than or equal to 3.2 atomic %. The lower the hydrogen content, the more preferably. In the meanwhile, the lower limit is approximately 1.0 atomic % in consideration of the conditions of the oxidation treatment as described later.

Conditions of the processes specified in the present invention; the formation of $SiO_x$ film (the first protective film), the oxidation treatment, and the formation of the second protective film respectively carried out after patterning of the source-drain electrode are explained in the following.

(Formation of $SiO_x$ Film (the First Protective Film))

A generally-known method may be adopted for the formation of the $SiO_x$ film. For example, a plasma chemical vapor deposition (CVD) method or a sputtering method may be adopted. For the CVD method, a deposition power, a deposition temperature, and a gas ratio of $SiH_4$ and $N_2O$ may be controlled as generally done. As indicated in following examples, a plasma treatment by using $N_2O$ gas may be conducted as a pretreatment before the formation of the $SiO_x$ film.

Thickness of the $SiO_x$ film is preferably to be controlled to 30 to 200 nm. If the thickness is small, conformality on the source-drain electrode becomes poor and it becomes liable to generate a region in which coverage by the $SiO_x$ film is not sufficient. In such a region, oxidation of the source-drain electrode (Mo based film, for example) is accelerated in the course of a heat treatment in an air atmosphere as described later, and the S value becomes liable to increase. Such a case is prominent as the film thickness is decreased. The thickness of the $SiO_x$ film is thus preferably 30 nm or larger, and more preferably 50 nm or larger although it depends on heating temperature for the heat treatment described later. The upper limit of the thickness of the $SiO_x$ film is preferably about 300 nm or smaller, and more preferably 200 nm or smaller from the viewpoint of the productivity.

Hydrogen content in the $SiO_x$ film is preferably to be controlled to 5.0 atomic % or smaller before an oxidation treatment which is explained later. By controlling the content of hydrogen, the hydrogen content in the film of 3.5 atomic % or lower may be easily attained by way of the oxidation treatment. As explained above, the lower the hydrogen content in the $SiO_x$ film is, the lower the hydrogen content in the oxide semiconductor layer which is in contact to the $SiO_x$ film, and the light stress stability becomes excellent. The hydrogen content in the $SiO_x$ film is more preferably 4.5 atomic % or lower. It is difficult, however, to suppress the content to 0 atomic %. Decrease of the hydrogen content in the SiO$_x$ film may be realized by decreasing the ratio of SiH$_4$ which is used for forming the SiO$_x$ film.

(Oxidation Treatment)

One or more kinds of a heat treatment and a N$_2$O plasma treatment may be exemplified as the oxidation treatment. It is preferable to conduct both a heat treatment and a N$_2$O plasma treatment.

The heat treatment may be conducted under the following conditions. The environment of the heating includes a water vapor atmosphere and an oxygen atmosphere, for example. The environment of the heating is preferably an oxygen atmosphere, and more preferably an air atmosphere. A nitrogen atmosphere is not preferable because there is a possibility of hindering the improvement of the light stress stability due to reduction of the surface of the oxide semiconductor by way of the SiO$_x$ film.

The heat treatment is preferably conducted at a temperature higher than or equal to 130° C., more preferably 200° C. or higher, and even more preferably 250° C. or higher. As the heating temperature increases, recovery of the oxygen deficiency, specifically surface oxidation of the oxide is enhanced, resulting in improvement of the light stress stability. On the other hand, excessively high heat treatment temperature is liable to deteriorate the source-drain electrode material. Specifically, the oxidation of the end of Mo source-drain electrode is enhanced, which is liable to deteriorate the switching characteristics. The heat treatment is thus preferably conducted at a temperature lower than or equal to 400° C., more preferably 380° C. or lower, and even more preferably 350° C. or lower. The holding time at the heating temperature (heating time) is preferably longer than or equal to 5 minutes, and more preferable 60 minutes or longer. Excessively long heating time deteriorates the productivity and more than certain effects cannot be expected. The heating time is thus preferably shorter than or equal to 120 minutes, and more preferably 90 minutes or shorter.

The N$_2$O plasma treatment, that is a plasma treatment by using N$_2$O gas, may be carried out under conditions of, for example, plasma power of 100 W, gas pressure of 133 Pa, treatment temperature of 200° C., treatment time of 10 seconds to 20 minutes.

(Formation of the Second Protective Film)

The second protective film is one or more passivation films formed on the first protective film. The second protective film either comprises an insulating compound film or is a laminate film comprising a resin film and the insulating compound film. The resin film is preferably disposed between the first protective film and the insulating compound film. These films work as a passivation film as well as a water-vapor-barrier film which suppresses penetration of water vapor to inside of a TFT.

There may be used as the insulating compound film are either a film consisting an oxide, a nitride, or an oxynitride film comprising one or more kinds of element selected from a group consisting Si, Al, Ti, Ta, Ce, Ga, Hf, Nb, V, W, Y, and Zr; or a laminate film comprising a resin film and the insulating compound film which is comprising either the oxide, the nitride, or the oxynitride. The insulating compound film is preferably a film consisting a SiN$_x$ film and the film consisting the oxide, that is one or more of the insulating oxide films. It is preferably an insulating oxide film. The insulating oxide film can decrease diffusion of hydrogen into an oxide semiconductor film because content of hydrogen is smaller than the SiN$_x$ film. The insulating oxide film is effective to secure the excellent light stress stability as is possesses water-vapor barrier characteristics as for a SiN$_x$ film. Hereinafter, one or more kinds of element selected from a group consisting of Si, Al, Ti, Ta, Ce, Ga, Hf, Nb, V, W, Y, and Zr is occasionally referred to as metal element X.

The insulating oxide film may be a film comprising an oxide containing one or more kinds of element selected from a group consisting of Si, Al, Ti, Ta, Ce, Ga, Hf, Nb, V, W, Y, and Zr. The insulating oxide film may be, for example, SiO$_x$, Al$_2$O$_3$, Ga$_2$O$_3$, HfO$_2$, Nb$_2$O$_5$, TiO$_2$, Ta$_2$O$_5$, V$_2$O$_5$, WO$_3$, Y$_2$O$_3$, and ZrO$_2$.

A generally-known method may be adopted for the formation of the insulating compound film which constitutes the second protective film. For example, a plasma chemical vapor deposition (CVD) method or a sputtering method may be adopted. For the CVD method, a deposition power, a deposition temperature, and a gas ratio may be controlled as generally done. For example, when a SiN$_x$ film is deposited as the second protective film, the gas ratio of SiH$_4$, N$_2$, and N$_2$O may be controlled as generally clone. For the sputtering method, a magnetron sputtering method may be adopted for example. Specifically, the insulating compound film may be deposited by conducting DC or RF sputtering using a sputtering target consisting of an oxide, a nitride, or an oxynitride containing the metal element X. The insulating compound film may also be deposited by conducting sputtering in an atmosphere comprising oxygen and nitrogen using a pure metal sputtering target or a metal alloy target containing the metal element X. Conditions of the sputtering such as the plasma power may be controlled as generally done.

The resin film may be a silicone-based resin film, a polyimide resin, an acrylic resin, or the like. A silicone-based resin film is generally used as a protective material for a liquid crystal display or a light emitting diode device. A silicone-based resin film may be inferior in terms of barrier property, and is preferably used by being combined with the insulating compound film as explained above. The silicone-based resin film may be formed by coating by way of a spray coating, a spin coating, a slit coating, or a roll coating method, followed by vaporizing solvent in the solvent in the coating fluid and being subjected to a heat treatment at about 200° C. for the purpose of improving the film quality. Thickness of the resin film may be a few hundred nanometers to a few micrometer. The thickness is preferably larger than or equal to 500 nm in the present invention.

The second protective film may be a single layer of an insulating compound film, a laminate comprising more than one layer of insulating compound films, a laminate comprising a resin film and a single layer of an insulating compound film, or a laminate comprising a resin film and more than one layer of insulating compound films.

Total thickness of the second protective film is preferably 10 to 500 nm when a resin film is not used. When the thickness of the second protective film is too thin, the film thickness is liable to be nonuniform, the blocking property to water paper is deteriorated, inviting penetration by hydrogen to the surface of the oxide semiconductor layer. As a result, the TFT characteristics is liable to vary. The total thickness of the second protective film is thus preferably 10 nm or larger, and more preferably 20 nm or larger. The upper limit of the total thickness of the second protective film is preferably about 500 nm or less, and more preferably 400 nm or less from the viewpoint of the productivity.

Total thickness of the second protective film is preferably 300 nm to 5.0 μm when a resin film is used. If thickness of the resin film in the second protective film is thin, the TFT characteristics are liable to vary as a result of penetration of hydrogen and water vapor which diffuse from either the air or the passivation film formed on the resin film through the resin film and the first protective film to the surface of the oxide semiconductor. The total thickness of the second protective film is preferably 300 nm or more, and more preferably 500 nm or more, accordingly. The upper limit of the total thickness of the second protective film is preferably about 5.0 µm or less, and more preferably 4.5 µm or less from the viewpoint of the productivity.

(Heat Treatment After Forming the Second Protective Film)

By conducting additional heat treatment after forming the second protective film, a shift amount of a threshold voltage $\Delta V_{th}$ (unit: V) may be suppressed even after sweeping the bias voltage multiple times. Hereinbelow, the additional heat treatment may be occasionally referred to as "post anneal". Recommended conditions of the post anneal are as follows. The heating environment may be a nitrogen atmosphere, an air atmosphere, or a vacuum atmosphere. The heating temperature is preferably 200° C. or higher, and more preferably 230° C. or higher. Excessively high heating temperature, on the other hand, enhances desorption of hydrogen from the first and second protective films. The heating temperature is preferably 320° C. or lower, and more preferably 300° C. or lower, accordingly. Retention time (heating time) at the heating temperatures is preferably 5 minutes or longer, and more preferably 60 minutes or longer. However, excessively long heating time would not provide more than a certain level of the effect and deteriorates the productivity. The heating time is preferably 120 minutes or shorter, and more preferably 90 minutes or shorter, accordingly. An example of the heat treatment condition is 250° C. for 30 minutes in a nitrogen atmosphere.

It is required for the TFT according to the present invention that the passivation film comprising more than one layer protecting the source-drain electrode and the oxide semiconductor layer to satisfy the above-described requirements; and to comprise processes of the formation of the first protective film, the oxidation treatment, and the formation of the second protective film in this order after patterning of the source-drain electrode in the manufacturing processes. Other than the requirements, the TFT and the manufacturing process are not particularly limited.

Figure 2:
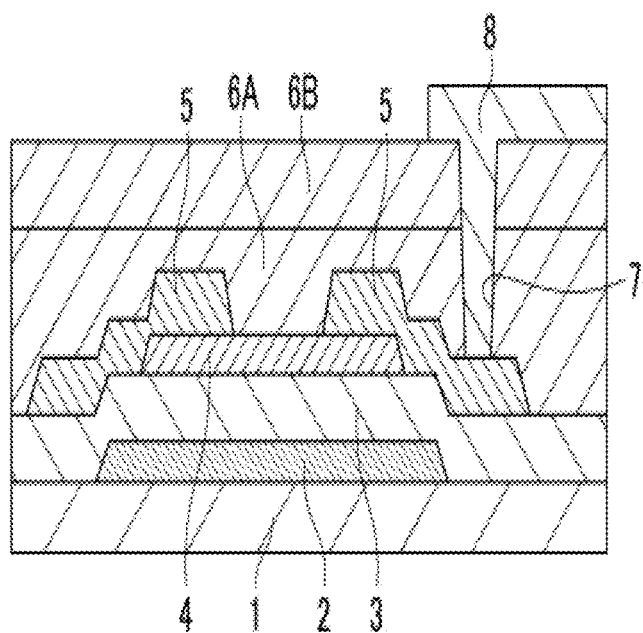
FIG. 2 is a schematic cross-sectional view for explaining a thin film transistor according to the present invention.

Referring to FIG. 2, embodiments of a fabrication process, including the oxidation treatment, of the TFT of the present invention are described in the following. FIG. 2 and the following fabrication process demonstrate one example of preferred embodiment of the present invention, but it is not intended that the present invention be limited thereto. While FIG. 2 depicts a TFT in which the second protective film is a single film, the present invention is not limited to that case. The present invention also encompasses a case in which the second protective film is a laminate film.

As shown in FIG. 2, a gate electrode 2 and a gate insulator film 3 are formed on the substrate 1, and an oxide semiconductor layer 4 is formed thereon. A source-chain electrode 5 is formed further thereon. As passivation films (insulating films), a first protective film 6A and a second protective film are formed thereon, and a transparent conductive film 8 is electrically connected to the drain electrode 5 through a contact hole 7.

The method of forming the gate electrode 2 and the gate insulator layer 3 on the substrate 1 is not particularly limited, and any of the methods usually used can be employed. The kinds of the gate electrode 2 and the gate insulator film 3 are not particularly limited, and those which are widely used can be adopted. For example, metals having low electrical resistivity, such as Al and Cu, refractory metals having high heat resistance, such as Mo, Cr and Ti, and their alloys, can preferably be used for the gate electrode 2. Typical examples of the gate insulator film may include a silicon oxide layer ($SiO_2$), a silicon nitride layer (SiN), and a silicon oxynitride layer (SiON). In addition, oxides such as $Al_2O_3$ and $Y_2O_3$, and their laminates may also be used.

Next, an oxide semiconductor layer 4 is deposited. The oxide semiconductor layer 4 may preferably be formed by a sputtering method such as a DC sputtering method or a RF sputtering method using a sputtering target. The sputtering target may hereinafter be referred to as the "target". The sputtering method requires no great effort to form a thin film having excellent uniformity in terms of composition or film thickness. The oxide layer can also be formed by a chemical film-formation method such as a coating method.

As a target to be used in the sputtering method, there may preferably be used a sputtering target containing the elements described above and having the same composition as that of a desired oxide, thereby making it possible to form a thin film showing small deviation of composition and having the same composition as that of the desired oxide.

Specifically, as the target for depositing the oxide semiconductor layer, an oxide target constituted of oxides of metals of Sn; and one or more kinds of element selected from a group consisting of In, Ga, and Zn, containing the elements described above and having the same composition as that of a desired oxide can be used. Alternatively, the formation of the layer may also be carried out by a combinatorial sputtering method in which two targets having different compositions are simultaneously discharged. Each of the targets as described above can be produced, for example, by a powder sintering method.

The sputtering may preferably be carried out under conditions as follows. Substrate temperature is set to a range of approximately from room temperature to 200° C. Additive amount of oxygen may appropriately be controlled according to the configuration of a sputtering system and compositions of the target so that the deposited oxide layer shows characteristics of a semiconductor. The additive amount of oxygen may preferably be controlled by the addition of oxygen so that the carrier concentration of the semiconductor becomes approximately from $10^{15}$ to $10^{16}$ $cm^{-3}$.

The gas pressure during the sputtering deposition may preferably be in a range of approximately from 1 to 3 mTorr. It is recommended to set the input power to about 200 W or higher.

After the formation of the oxide semiconductor layer 4 as described above, the oxide semiconductor layer 4 is subjected to wet etching and then patterning. After the patterning, heat treatment (pre-annealing) may preferably be carried out for the purpose of improving the quality of the oxide semiconductor layer, which leads to an increase in the on-state current and field-effect mobility as the transistor characteristics and an improvement in the transistor performance. The pre-annealing conditions may be, for example, such that the temperature is from about 250° C. to 400° C. and the duration is from about 10 minutes to 1 hour, in an air or steam atmosphere.

After the pre-annealing, a source-drain electrode 5 is formed. As an acid-based etchant solution is used for patterning formation of the source-drain electrode in the present invention, preferably adopted for the source-drain electrode is a Mo-based film consisting one or more of a pure Mo film and a Mo alloy film; or a laminate film comprising the Mo-based film and one or more kinds of film selected from a group consisting a pure Al film, a pure Cu film, an Al alloy film, and a Cu alloy film. The Mo alloy film comprises Mo in an amount of 50 atomic % or more, the Al alloy film comprises Al in an amount of 50 atomic % or more, and the Cu alloy film comprises Cu in an amount of 50 atomic % or more.

If the source-drain electrode is a laminate film, it is preferably formed so that one or more of the pure Mo film and the Mo alloy film is in direct contact to an oxide semiconductor layer. If other kinds of film such as a pure Cu film is in direct contact to the oxide semiconductor layer, the switching characteristics are liable to be deteriorated as compared to those having a Mo-based film which is directly contacted to the oxide semiconductor layer because of diffusion of Cu to a surface of the oxide semiconductor and generation of Cu residues.

As compared to a case in which the source-drain electrode consists solely the Mo based film, it is more preferable that the source-drain electrode 5 is a laminate film consisting a Mo based film and one or more kinds of film selected from a pure Al film, a pure Cu film, an Al alloy film, and a Cu alloy film. It is because degree of oxidation at an end of Mo film is less when the film is subjected to the oxidation treatment. The laminate film is more preferably a laminate film comprising a Mo based film and one or more kinds of film selected from a pure Al film and an Al alloy film.

The source-drain electrode 5 may be formed by way of depositing the metal thin film using, for example, a magnetron sputtering method followed by patterning via photolithography and acid wet etching using an acid-based etchant solution. Thickness of the source-drain electrode 5 may be in a range from 50 to 300 nm, for example. When the thickness of the source-drain electrode is smaller than 50 nm and too thin, the film may be liable to disappear in the latter process, for example, during etching of the contact hole carried out by using a RIE apparatus. When the thickness of the source-drain electrode is larger than 300 nm and too thick, coverage of the passivation film is deteriorated and problems such as oxidation of the source-drain electrode are liable to occur.

According to the present invention, even if the patterining of the source-drain electrode was carried out by using an acid-based solution having 50 volume % or higher of one or more kinds of acid selected from a group consisting of a phosphoric acid, a nitric acid, and an acetic acid, it was possible to recover the surface of the oxide semiconductor layer being subjected to the acid-based etchant by the oxidation treatment as described above. It was thus possible to obtain the TFT of excellent stress stability.

Carried out next are in the order of; the formation of the first protective film ($SiO_x$ film) 6A, the oxidation treatment, and the formation of the second protective film 6B as the PV process.

Then, according to a conventional method, a transparent conductive film 8 is electrically connected to the drain electrode 5 through the contact hole 7. The kind of the transparent conductive film 8 is not particularly limited, and there can be used those which have usually been used.

Numbers of masks to be formed in the course of fabrication process of TFTs are decreased because the TFT according to the present invention does not have an etch stopper layer. The manufacturing cost can be sufficiently reduced, accordingly.

EXAMPLES

The present invention is described hereinafter more specifically by way of examples, but the present invention is not limited to the following examples. The present invention can be put into practice after appropriate modifications or variations within a range meeting the gist described above and below, all of which are included in the technical scope of the present invention.

Example 1

[Fabrication of TFT of the Present Inventive Example]

Thin film transistor shown in FIG. 2 was fabricated based on a method as described above.

First, a Mo thin film of 100 nm in thickness as a gate electrode 2 and $SiO_2$ film of 250 nm in thickness as a gate insulator film 3 were successively deposited on a glass substrate 1 ("EAGLE XG" available from Corning Inc, having a diameter of 100 mm and a thickness of 0.7 mm). The gate electrode 2 was deposited using a pure Mo sputtering target by a DC sputtering method under the conditions; deposition temperature of room temperature; sputtering power of 300 W; carrier gas of Ar; and gas pressure of 2 mTorr. Further, the gate insulator layer 3 was formed by a plasma CVD method under the conditions; carrier gas of a mixed gas of $SiH_4$ and $N_2O$; plasma power of 300 W; and deposition temperature of 350° C.

Next, an oxide semiconductor layer of 40 nm in thickness was deposited as follows. The oxide semiconductor layer 4 (Ga—In—Zn—Sn—O of Ga:In:Zn:Sn=16.8:16.6:47.2:19.4 in atomic % ratio) was deposited on a gate insulator film 3.

For the deposition of the oxide semiconductor layer 4, a Ga—In—Zn—Sn—O sputtering target having the ratio shown above was used.

The oxide semiconductor layer 4 was formed by DC sputtering method. The apparatus used in the sputtering was "CS-200" available from ULVAC, Inc., and the sputtering conditions were as follows:

(Sputtering Conditions)
  Substrate temperature: room temperature
  Film formation power: DC 200 W
  Gas pressure: 1 mTorr
  Oxygen partial pressure: $100×O_2/(Ar+O_2)$=10%

After the oxide semiconductor layer 4 was deposited in the manner described above, patterning was carried out by photolithography and wet etching "ITO-07N" (a mixed solution of oxalic acid and water) available from Kanto Chemical Co., Inc., was used as an acid-based wet etchant whose temperature was room temperature. It was confirmed in the present Example that all of the oxide thin films subjected to the experimental were appropriately etched without forming etching residues.

After patterning of the oxide semiconductor layer 4, a pre-annealing treatment was carried out to improve the film quality. The pre-annealing was conducted at 350° C. for 60 minutes in an air atmosphere.

Then, a source-drain electrode 5 was deposited. Specifically, a pure Mo thin film, or a laminate of the pure Mo film with a pure Al film or a pure Cu film, was deposited as indicated in Table 1 and Table 2. Each of the laminate films indicated in Table 1 was formed on the oxide semiconductor layer 4 by forming metal films in the order from the left as indicated in Table 1. These single layer films or laminate films were deposited by a DC sputtering method as for the above-described gate electrode. Thickness of the single layer film or total thickness of the laminate film was 100 nm. The films were subsequently patterned by photolithography and wet etching. As an acid-based etchant solution, a mixed acid with a volume ratio of phosphoric acid:nitric acid:acetic acid:water=70:1.9:10:12 (PAN acid) was used as the wet etchant at room temperature. For the purpose of making sure to prevent shunting the source-drain electrode, each of the films was over-etched in the acid-based etchant solution by 50% with respect to the thickness of the electrode 5 to obtain each of the TFT having a channel length of 10 μm and a channel width of 200 μm.

Next for the formation of the passivation film, a $SiO_2$ film was formed as a first protective film 6A. The formation of the $SiO_2$ film was carried out by a plasma CVD method using "PD-220NL" available from SAMCO Inc. In this example, after a plasma treatment was carried out for 60 seconds by using $N_2O$ gas, the $SiO_2$ film was formed. The plasma treatment by using $N_2O$ gas was conducted at a plasma power of 100 W, a gas pressure of 133 Pa, a treatment temperature of 200° C., and a treatment time of 1 minute. A mixed gas of $N_2O$ and $SiH_4$ was used for the formation of the $SiO_2$ film. The film formation power was set to 100 W and the film formation temperature was set to 230° C. The gas ratio of $SiH_4$ and $N_2O$ was controlled so as to $SiH_4$:$N_2O$ is either 40:100, 20:100, or 10:100. In the present example, the ratio was on the basis of 40:100. In this case, the content of hydrogen was 4.3 atomic % in the $SiO_2$ film. Thickness of the $SiO_2$ film was basically 200 nm while some of the films were 100 nm or 20 nm in thickness.

Subsequently, a heating treatment was carried out at a temperature of 120° C., 200° C., 250° C., 300° C., 350° C., 400° C., or 500° C. in an air atmosphere for 60 minutes.

Then, in Nos. 1 to 18 in Table 1 and Nos. 19 to 24 in Table 2, a $SiN_x$ film having a thickness of 150 nm was formed as a second protective film 6B. The formation of the $SiN_x$ film was carried out by a plasma CVD method using "PD-220NL" available from SAMCO Inc. A mixed gas of $SiH_4$, $N_2$ and $NH_3$ was used for the formation of the $SiN_x$ film. The film formation power was set to 100 W and the film formation temperature was set to 150° C.

An aluminum oxide film in No. 25, a Ta oxide film in Nos. 28 and 26, a Ti oxide film in No. 27, and a laminate of a silicone resin film and a $SiN_x$ film in No. 28 of Table 2 were respectively formed as the second passivation film 6B in Table 2. For the formation of the Al oxide film, the Ta oxide film, and the Ti oxide film, a sputtering target consisting of an Al oxide, a sputtering target consisting of an Ta oxide, and a sputtering target consisting of an Ti oxide were respectively used. Each of the films was deposited on the first protective film by a RF sputtering method. Sputtering conditions were; an input power density of 2.5 W/cm$^2$, a gas pressure of 5 mTorr, a gas flow ratio of Ar/$O_2$=80/20, a film thickness of 20 nm, and a substrate temperature of a room temperature. For No. 28, the silicone resin film was formed by spin-coating a photo-curable silicon resin on the first protective film. On the silicone resin film, a $SiN_x$ film was formed by a plasma CVD method as described above.

Then, a contact hole 7 to be used for probing to evaluate transistor characteristics was formed in the protective layers 6A and 6B by photolithography and dry etching, to obtain a TFT.

A comparative example TFT indicated as No. 24 in Table 2 was prepared in the same manner except that it comprises a single layer of In—Ga—Zn—O as an oxide semiconductor layer. The IGZO film was composed of In:Ga:Zn=1:1:1 in atomic ratio and did not contain Sn. A comparative example TFT indicated as No. 1 in Table 1 was also prepared in the same manner except that it was not subjected to the oxidation treatment. Another comparative example TFT indicated as No. 2 in Table 1 was prepared in the same manner except that it was subjected to the oxidation treatment before forming a $SiO_x$ film as the first protective film. That is, No. 2 in Table 1 was prepared in the order of; the formation of a source-drain electrode, the oxidation treatment, the formation of the first protective film, and the formation of the second protective film.

For each of the TFTs thus obtained, static characteristics and stress stability were evaluated as shown below.

[Evaluation of the Static Characteristics (Field-Effect Mobility (Mobility) and S Value)]

Using a prober and a semiconductor parameter analyzer, available from Keithley 4200 SCS, $I_d$-$V_g$ characteristics was obtained for each of the TFTs thus obtained under the gate and source-drain electrode voltages shown below.

Gate voltage: –30 to 30 V (increment of 0.25 V)
Source voltage: 0 V
Drain voltage: 10 V
Measurement temperature: room temperature From the $I_d$-$V_g$ characteristics, the field-effect mobility (the mobility) and S value were determined. If the mobility was larger than or equal to 7.00 cm$^2$/Vs, then the TFT was categorized to be satisfactory. In terms of the S value, the evaluation criteria were as follows.

○: the S value was smaller than or equal to 0.45 V/dec
Δ: the S value was larger than 0.45 V/dec and smaller than or equal to 1.00 V/dec
x: the S value was larger than 1.00 V/dec

[Evaluation of Stress Stability]

For each of the TFTs thus obtained, stress stability was then evaluated as shown below.

The stress stability was evaluated by a stress application test in which by light irradiation while applying negative bias to the gate electrode. The stress application test conditions were as described below.

Gate voltage: –20 V
Source-drain voltage: 10 V
Substrate temperature: 60° C.
Light stress conditions:
Stress application time: 2 hours
Light intensity: 25,000 NIT
Light source: white LED Difference in threshold voltage $V_{th}$, a value of gate bias for which a drain current of $10^{-9}$ flows, before and after applying a stress bias was measured. The difference is hereinafter referred to as x$V_{th}$. Regarding $\Delta V_{th}$ value thus obtained, the judgment criteria were as follows. If the $\Delta V_{th}$ was smaller than or equal to 4.50 V, then the TFT was evaluated to be excellent in terms of the stress stability.

(Judgment Criteria)

○: absolute value of $\Delta V_{th}$ was smaller than or equal to 4.50 V
Δ: absolute value of $\Delta V_{th}$ was larger than 4.50 V and smaller than or equal to 6.50 V
x: absolute value of $\Delta V_{th}$ was larger than 6.50 V The results are summarized in Table 1 and Table 2. In some of examples of Table 1 and Table 2, hydrogen concentrations in the $SiO_x$ film after the oxidation treatment were measured by using secondary ion mass spectroscopy (SIMS) explained later in Example 3.

TABLE 1

| No. | Oxide semiconductor layer | S/D electrode | Thickness of SiO$_x$ film (nm) | Oxidation treatment Process sequence | Oxidation treatment Conditions (Heating temperature/Ambience) | Hydrogen content in SiO$_x$ film Before oxidation treatment (at %) | Hydrogen content in SiO$_x$ film After oxidation treatment (at %) | Second protective film material | Mobility (cm$^2$/Vs) | S value (V/dec) | S value Judgement | Light stress stability ΔV$_{th}$ (V) | Light stress stability Judgement | Total judgement |
|---|---|---|---|---|---|---|---|---|---|---|---|---|---|---|
| 1 | In—Ga—Zn—Sn—O | Mo | 200 | None | — | 4.3 | 4.3 | SiN$_x$ | 7.74 | 0.37 | ○ | 7.50 | X | X |
| 2 | In—Ga—Zn—Sn—O | Mo | 200 | Heat treatment before forming SiO$_x$ film | 350° C./Air | 4.3 | — | SiN$_x$ | 6.44 | 1.12 | X | 3.50 | ○ | X |
| 3 | In—Ga—Zn—Sn—O | Mo | 200 | Heat treatment after forming SiO$_x$ film | 120° C./Air | 4.3 | — | SiN$_x$ | 7.50 | 0.35 | ○ | 6.50 | Δ | Δ |
| 4 | In—Ga—Zn—Sn—O | Mo | 200 | Heat treatment after forming SiO$_x$ film | 200° C./Air | 4.3 | — | SiN$_x$ | 7.70 | 0.30 | ○ | 5.00 | Δ | Δ |
| 5 | In—Ga—Zn—Sn—O | Mo | 200 | Heat treatment after forming SiO$_x$ film | 250° C./Air | 4.3 | 3.4 | SiN$_x$ | 7.80 | 0.25 | ○ | 3.25 | ○ | ○ |
| 6 | In—Ga—Zn—Sn—O | Mo | 200 | Heat treatment after forming SiO$_x$ film | 300° C./Air | 4.3 | 3.5 | SiN$_x$ | 7.90 | 0.28 | ○ | 1.75 | ○ | ○ |
| 7 | In—Ga—Zn—Sn—O | Mo | 200 | Heat treatment after forming SiO$_x$ film | 350° C./Air | 4.3 | 2.5 | SiN$_x$ | 8.00 | 0.40 | ○ | 3.50 | ○ | ○ |
| 8 | In—Ga—Zn—Sn—O | Mo | 200 | Heat treatment after forming SiO$_x$ film | 400° C./Air | 4.3 | 3.2 | SiN$_x$ | 8.30 | 0.60 | Δ | 4.00 | ○ | Δ |
| 9 | In—Ga—Zn—Sn—O | Mo | 200 | Heat treatment after forming SiO$_x$ film | 500° C./Air | 4.3 | — | SiN$_x$ | 8.20 | 1.30 | X | 4.00 | ○ | X |
| 10 | In—Ga—Zn—Sn—O | Mo | 200 | Heat treatment after forming SiO$_x$ film | 300° C./Air | 3.4 | — | SiN$_x$ | 7.50 | 0.22 | ○ | 1.70 | ○ | ○ |
| 11 | In—Ga—Zn—Sn—O | Mo | 200 | Heat treatment after forming SiO$_x$ film | 300° C./Air | 2.5 | — | SiN$_x$ | 7.30 | 0.20 | ○ | 1.50 | ○ | ○ |
| 12 | In—Ga—Zn—Sn—O | Mo/Al/Mo | 200 | Heat treatment after forming SiO$_x$ film | 250° C./Air | 4.3 | 3.4 | SiN$_x$ | 7.70 | 0.24 | ○ | 3.30 | ○ | ○ |
| 13 | In—Ga—Zn—Sn—O | Mo/Al/Mo | 200 | Heat treatment after forming SiO$_x$ film | 300° C./Air | 4.3 | 3.5 | SiN$_x$ | 8.00 | 0.28 | ○ | 1.90 | ○ | ○ |
| 14 | In—Ga—Zn—Sn—O | Mo/Al/Mo | 200 | Heat treatment after forming SiO$_x$ film | 350° C./Air | 4.3 | 2.5 | SiN$_x$ | 7.90 | 0.37 | ○ | 3.20 | ○ | ○ |
| 15 | In—Ga—Zn—Sn—O | Mo/Al/Mo | 200 | Heat treatment after forming SiO$_x$ film | 400° C./Air | 4.3 | 3.2 | SiN$_x$ | 8.20 | 0.45 | ○ | 3.80 | ○ | ○ |
| 16 | In—Ga—Zn—Sn—O | Mo/Al/Mo | 200 | Heat treatment after forming SiO$_x$ film | 500° C./Air | 4.3 | — | SiN$_x$ | 8.40 | 1.10 | X | 4.10 | ○ | X |
| 17 | In—Ga—Zn—Sn—O | Mo/Cu | 200 | Heat treatment after forming SiO$_x$ film | 250° C./Air | 4.3 | 3.4 | SiN$_x$ | 8.00 | 0.32 | ○ | 3.60 | ○ | ○ |
| 18 | In—Ga—Zn—Sn—O | Mo/Cu | 200 | Heat treatment after forming SiO$_x$ film | 300° C./Air | 4.3 | 3.5 | SiN$_x$ | 8.30 | 0.39 | ○ | 3.30 | ○ | ○ |

TABLE 2

| No. | Oxide semiconductor layer | S/D electrode | Thickness of $SiO_x$ film (nm) | Oxidation treatment Process sequence | Oxidation treatment Conditions (Heating temperature/ Ambience) | Hydrogen content in $SiO_x$ film Before oxidation treatment (at %) | Hydrogen content in $SiO_x$ film After oxidation treatment (at %) |
|---|---|---|---|---|---|---|---|
| 19 | In—Ga—Zn—Sn—O | Mo | 100 | Heat treatment after forming $SiO_x$ film | 250° C./Air | 4.3 | — |
| 20 | In—Ga—Zn—Sn—O | Mo | 100 | Heat treatment after forming $SiO_x$ film | 300° C./Air | 4.3 | — |
| 21 | In—Ga—Zn—Sn—O | Mo | 30 | Heat treatment after forming $SiO_x$ film | 250° C./Air | 4.3 | — |
| 22 | In—Ga—Zn—Sn—O | Mo | 30 | Heat treatment after forming $SiO_x$ film | 300° C./Air | 4.3 | — |
| 23 | In—Ga—Zn—Sn—O | Mo | 20 | Heat treatment after forming $SiO_x$ film | 250° C./Air | 4.3 | — |
| 24 | In—Ga—Zn—O | Mo | 200 | Heat treatment after forming $SiO_x$ film | 300° C./Air | 4.3 | 3.5 |
| 25 | In—Ga—Zn—Sn—O | Mo | 200 | Heat treatment after forming $SiO_x$ film | 300° C./Air | 4.3 | 2.4 |
| 26 | In—Ga—Zn—Sn—O | Mo | 200 | Heat treatment after forming $SiO_x$ film | 300° C./Air | 4.3 | 2.4 |
| 27 | In—Ga—Zn—Sn—O | Mo | 200 | Heat treatment after forming $SiO_x$ film | 300° C./Air | 4.3 | 2.4 |
| 28 | In—Ga—Zn—Sn—O | Mo | 200 | Heat treatment after forming $SiO_x$ film | 300° C./Air | 4.3 | 2.0 |

| No. | Second protective film material | Mobility (cm²/Vs) | S value S value (V/dec) | S value Judgement | Light stress stability $\Delta V_{th}$ (V) | Light stress stability Judgement | Total judgement |
|---|---|---|---|---|---|---|---|
| 19 | $SiN_x$ | 7.50 | 0.35 | ○ | 2.90 | ○ | ○ |
| 20 | $SiN_x$ | 7.40 | 0.41 | ○ | 2.60 | ○ | ○ |
| 21 | $SiN_x$ | 7.30 | 0.42 | ○ | 2.70 | ○ | ○ |
| 22 | $SiN_x$ | 7.00 | 0.45 | ○ | 2.50 | ○ | ○ |
| 23 | $SiN_x$ | 7.20 | 0.70 | Δ | 2.00 | ○ | Δ |
| 24 | $SiN_x$ | 5.00 | 1.30 | X | 7.90 | X | X |
| 25 | $Al_2O_3$ | 9.91 | 0.27 | ○ | 2.00 | ○ | ○ |
| 26 | $Ta_2O_5$ | 7.80 | 0.30 | ○ | 2.50 | ○ | ○ |
| 27 | $TiO_2$ | 7.90 | 0.38 | ○ | 3.20 | ○ | ○ |
| 28 | Silicone resin film + $SiN_x$ film | 8.30 | 0.25 | ○ | 1.80 | ○ | ○ |

The results shown in Table 1 and Table 2 can be summarized as follows. Firstly, an explanation is provided on the heat treatment after the formation of the $SiO_x$ film. When the oxidation treatment was not conducted as for example No. 1 as for example No. 2, the stress stability was deteriorated. When the heat treatment was carried out before the formation of the $SiO_x$ film, the S value was increased. FIG. 11 are FE-SEM pictures of cross sections of the obtained TFTs. FIG. 11A is the picture of No. 2 while FIG. 11B is the picture of No. 7 which is a present inventive example. Thickness of the Mo oxide film was 20 to 30 nm at an edge of the source-drain electrode as illustrated by arrows in FIG. 11A. Thickness of the Mo oxide film was 5 nm or thinner at an edge of the source-drain electrode as illustrated by arrows in FIG. 11B. By comparing these values, it was revealed that the Mo oxide was thick when formed by a conventional method and that formation of the Mo oxide was satisfactory suppressed by the method according to the present invention.

Figure 12:
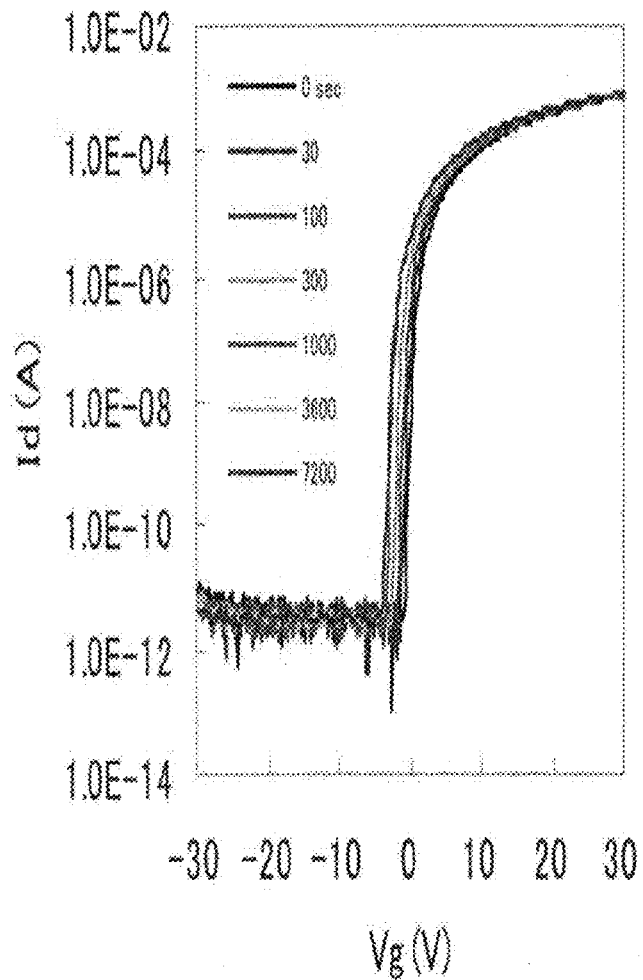
FIG. 12 is I$_d$-V$_g$ characteristics of No. 5 TFT in Table 1.
Figure 13:
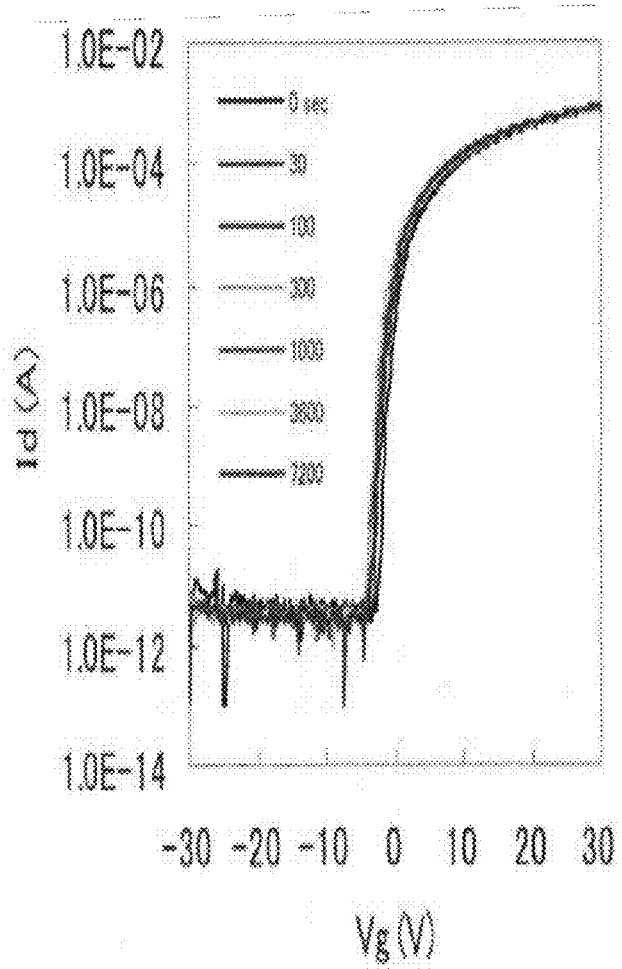
FIG. 13 is I$_d$-V$_g$ characteristics of No. 6 TFT in Table 1.

Examples No. 3 to 9 were examples for which the heat treatment temperature was varied between 120° C. and 500° C. Among these examples, No. 3 was slightly inferior in terms of the stress stability although it was not as bad as No. 1. Even though a heat treatment was performed after the formation of the $SiO_x$ film, the heat treatment temperature was relatively low for No. 3. When the heat treatment temperature was excessively high, the S value was increased as in the case of No. 9. Further, by comparing No. 4 and No. 5, it was elucidated that the light stress stability was further improved by elevating the heat treatment temperature to 250° C. or higher. $I_d$-$V_g$ characteristics of No. 5 and No. 6 TFTs in Table 1 are plotted in FIG. 12 and FIG. 13, respectively. Both No. 5 and No. 6 are inventive examples. For example No. 5, the PV process was performed in the order of the formation of the $SiO_x$ film, the heat treatment at 250° C. for 60 minutes in air, and the formation of the $SiN_x$ film. For example No. 6, the PV process was performed in the order of the formation of the $SiO_x$ film, the heat treatment at 300° C. for 60 minutes in air, and the formation of the $SiN_x$ film. By comparing these, it was found that the stress stability was further improved by increasing the heat treatment temperature.

Figure 14:
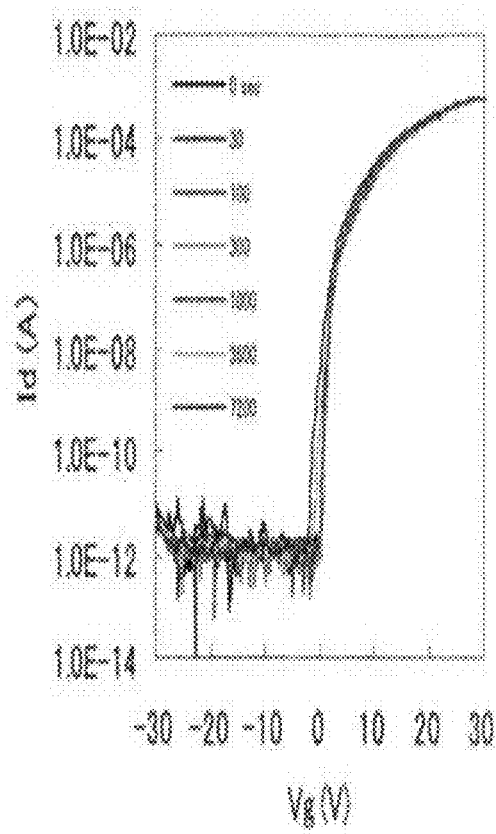
FIG. 14 is $I_d$-$V_g$ characteristics of No. 25 TFT in Table 2.

Further, illustrated in FIG. 14 is $I_d$-$V_g$ characteristics of the TFT comprising an alumina as the second protective film as indicated in No. 25 of Table 2. It can be seen by comparing FIG. 14 and FIG. 12 in which a $SiN_x$ was used that $\Delta V_{th}$ became sufficiently small when an alumina was used as the second protective film.

Furthermore, it can be seen by comparing No. 7 and No. 8 that the stress stability was further improved by controlling the heat treatment temperature to lower than 400° C.

By comparing Nos. 5 to 8, 12 to 15, 17, and 18 to No. 1 in Table 1, it was found that the amount of hydrogen in the $SiO_x$ film was decreased from 4.3 atomic % to 3.5 atomic % or lower as a result of heating, that was an oxidation treatment at the treatment temperature of 250° C. or higher. Decreasing the amount of hydrogen in the $SiO_x$ film is one of the factors to secure the good light stress stability.

By comparing No. 5 and 12, No. 6 and 13, No. 7 and 14, and Nos. 8 and 15, respectively, it was found that the S values were liable to be decreased when the source-drain electrode was a Mo/Al/Mo laminate instead of a Mo-based film. It was considered because volume of oxidized Mo end was relatively smaller and hence the negative effect was limited when a Mo/Al/Mo laminate was employed instead of a Mo-based film.

By comparing No. 12 and 17, and No. 13 and 18, respectively, it was found that the S values were smaller when the source-drain electrode was a Mo/Al/Mo laminate instead of comprising Cu. It was considered because the switching characteristics were deteriorated due to diffusion of Cu as well as generation of residues on the surface of the oxide semiconductor when Cu was contained in the source-drain electrode.

No. 10 and No. 11 were embodiments in which hydrogen contents in the $SiO_x$ film were smaller than that of No. 6 before the oxidation treatment. The stress stability of No. 10 and No. 11 were superior to that of No. 6. The excellent light stress stability was considered because smaller amount of hydrogen in the oxide semiconductor layer due to smaller amount of hydrogen in the $SiO_x$ film before the oxidation treatment.

Nos. 19 to 23 were embodiments in which respective thickness of the $SiO_x$ film was smaller than those of No. 5 and No. 6. The thickness of the $SiO_x$ film was particularly small in No. 23. By comparing No. 5 and Nos. 19, 21, and 23, and No. 6 and Nos. 20 and 22, respectively, it was found that the S values were increased with decreasing the thickness of the $SiO_x$ film. This may be explained as follows. When the thickness of the $SiO_x$ film was very thin as for No. 23, the source-drain electrode was not completely covered by the $SiO_x$ film, leaving some regions which were not covered by the $SiO_x$ film. In such a case, oxidation of the source-drain electrode was enhanced by a heat treatment, particularly by a heat treatment in air, after forming the $SiO_x$ film, causing increase of the S value.

Both the S value and the light stress stability were deteriorated in No. 24. Due to absence of Sn in the oxide semiconductor layer, decrease of the oxide semiconductor layer was 5% or larger, causing in-plane nonuniformity of the film thickness.

Nos. 25 to 28 were embodiments in which a film other than $SiN_x$ was employed for respective second protective film. An Al oxide film, a Ta oxide film, and a Ti oxide film were used for Nos. 25, 26, and 27, respectively. As for those having a $SiN_x$ film, excellent static characteristics and light stress stability were secured when these films were used for the second protective film. No. 28 was an embodiment for which a laminate comprising a silicone resin film and a $SiN_x$ film was used. Fine characteristics were attained in the embodiment. Amount of hydrogen in the respective $SiO_x$ film was sufficiently decreased after the oxidation treatment in Nos. 25 to 28. From these results, it was found that fine characteristics were obtained when a film excellent in vapor barrier property was used for the second protective film, instead of or combined with a $SiN_x$ film.

Example 2

Thin film transistors were prepared in the same manner as the example 1 except that respective oxidation treatment after forming a $SiO_x$ film was carried out as described in Table 3 and a post annealing heat treatment was performed at 250° C. for 30 minutes in a nitrogen atmosphere after forming a $SiN_x$ film.

After sweeping the bias from −30 V to +30 V for three times, $\Delta V_{th}$ was measured by repeating the sweep between −30 V and +30 V for each of the TFTs.

The results are indicated in Table 3. In some of examples of Table 3, hydrogen concentrations in the $SiO_x$ film after the oxidation treatment were measured by using secondary ion mass spectroscopy explained later in example 3.

TABLE 3

| No. | Oxide semiconductor layer | S/D electrode | Thickness of $SiO_x$ film (nm) | Process sequence | Oxidation treatment Conditions (Heating temperature/ Ambience) | Hydrogen content in $SiO_x$ film Before oxidation treatment (at %) | Hydrogen content in $SiO_x$ film After oxidation treatment (at %) | Heat treatment after forming $SiN_x$ film | Threshold value shift after multiple sweeping $\Delta V_{th}$ (V) Before heat treatment | Threshold value shift after multiple sweeping $\Delta V_{th}$ (V) After heat treatment |
|---|---|---|---|---|---|---|---|---|---|---|
| 1 | In—Ga—Zn—Sn—O | Mo | 200 | None | — | 4.3 | 4.3 | 250° C./$N_2$ | 1.75 | 0.50 |
| 2 | In—Ga—Zn—Sn—O | Mo | 200 | Heat treatment after forming $SiO_x$ film | 120° C./Air | 4.3 | — | 250° C./$N_2$ | 2.00 | 0.50 |
| 3 | In—Ga—Zn—Sn—O | Mo | 200 | Heat treatment after forming $SiO_x$ film | 200° C./Air | 4.3 | — | 250° C./$N_2$ | 1.75 | 0.75 |
| 4 | In—Ga—Zn—Sn—O | Mo | 200 | Heat treatment after forming $SiO_x$ film | 250° C./Air | 4.3 | 3.4 | 250° C./$N_2$ | 1.75 | 1.00 |
| 5 | In—Ga—Zn—Sn—O | Mo | 200 | Heat treatment after forming $SiO_x$ film | 300° C./Air | 4.3 | 3.5 | 250° C./$N_2$ | 1.50 | 1.00 |
| 6 | In—Ga—Zn—Sn—O | Mo | 200 | Heat treatment after forming $SiO_x$ film | 350° C./Air | 4.3 | 2.5 | 250° C./$N_2$ | 1.00 | 1.25 |

The results shown in Table 3 can be summarized as follows. Variation of $V_{th}$, that is $\Delta V_{th}$, was sufficiently decreased by performing the post annealing heat treatment after forming a second protective film. The decrease of variation in $V_{th}$ was considered due to diffusion of hydrogen from the second protective film to the oxide semiconductor layer and the latter layer was properly terminated by hydrogen. It was also elucidated that the decrease of $\Delta V_{th}$ by the post annealing was more significant when the temperature of the heat treatment performed as the oxidation treatment was lower.

Example 3

Thin film transistors comprising a source-drain electrode of a Mo single layer and a second protective film of a $SiN_x$ single layer were prepared in the same manner as example 1 except that the oxidation treatment after forming a $SiO_x$ film was not conducted or performed in air for 60 minutes at a heating temperature of 250° C., 300° C., 350° C., 400° C., or 500° C.

Figure 15:
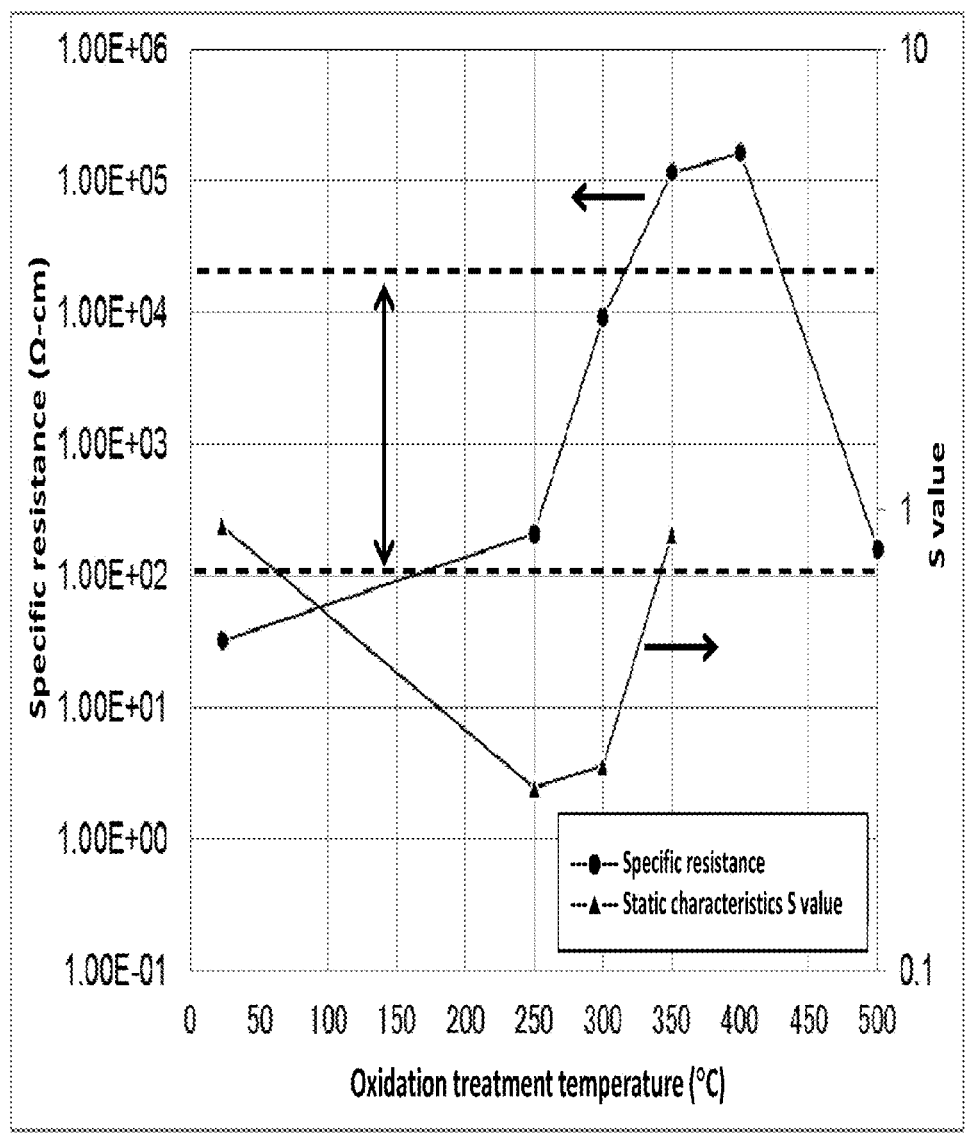
FIG. 15 is a graph indicating relations of S value and specific resistance to heat treatment temperature in an embodiment.
Figure 16:
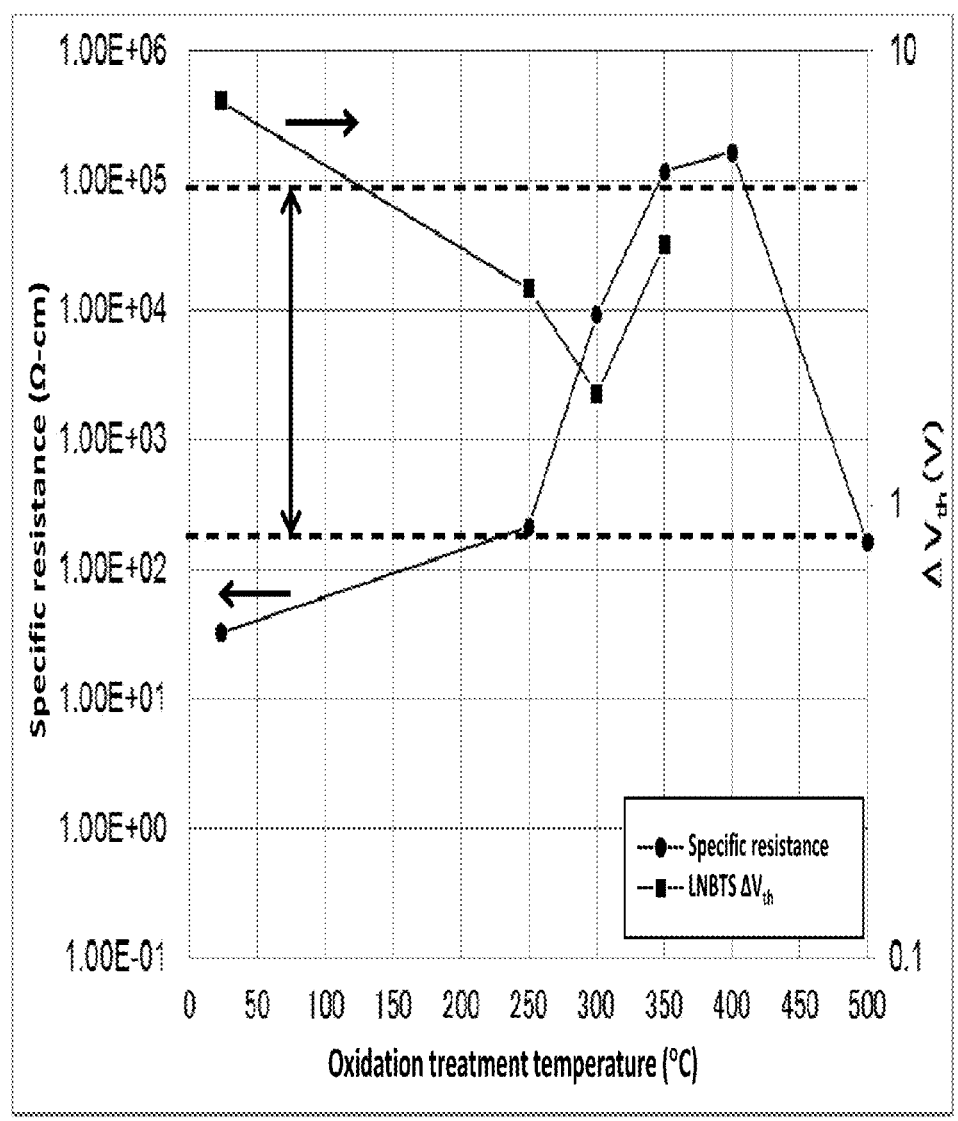
FIG. 16 is a graph indicating relations of $\Delta V_{th}$ and specific resistance to heat treatment temperature in an embodiment.

Specific resistance of respective oxide layer was measured by van der Pauw method which is a generally-known method for measurement of the specific resistance. The specific samples for the measurement were prepared as follows. Each oxide semiconductor film was patterned to a 5 mm square in size and Mo electrodes of a few hundreds of microns square in size were formed at the four corners of the square pattern of the oxide semiconductor film. Static characteristics represented by the S value and the stress stability were evaluated in the same manner as in example 1 by using the TFT devices. The results are summarized in FIG. 15 and FIG. 16. FIG. 15 is a graph indicating relations of the S value and the specific resistance to the heat treatment temperature. FIG. 16 is a graph indicating relations of $\Delta V_{th}$ and the specific resistance to the heat treatment temperature. The temperature of the heat treatment is indicated as "oxidation treatment temperature" in FIG. 15 and FIG. 16. "1.00E+06" for example of the longitudinal axis represents $1.00 \times 10^6$ in FIG. 15 and FIG. 16. Further, $\Delta V_{th}$ in FIG. 16 is plotted in absolute value.

Figure 17:
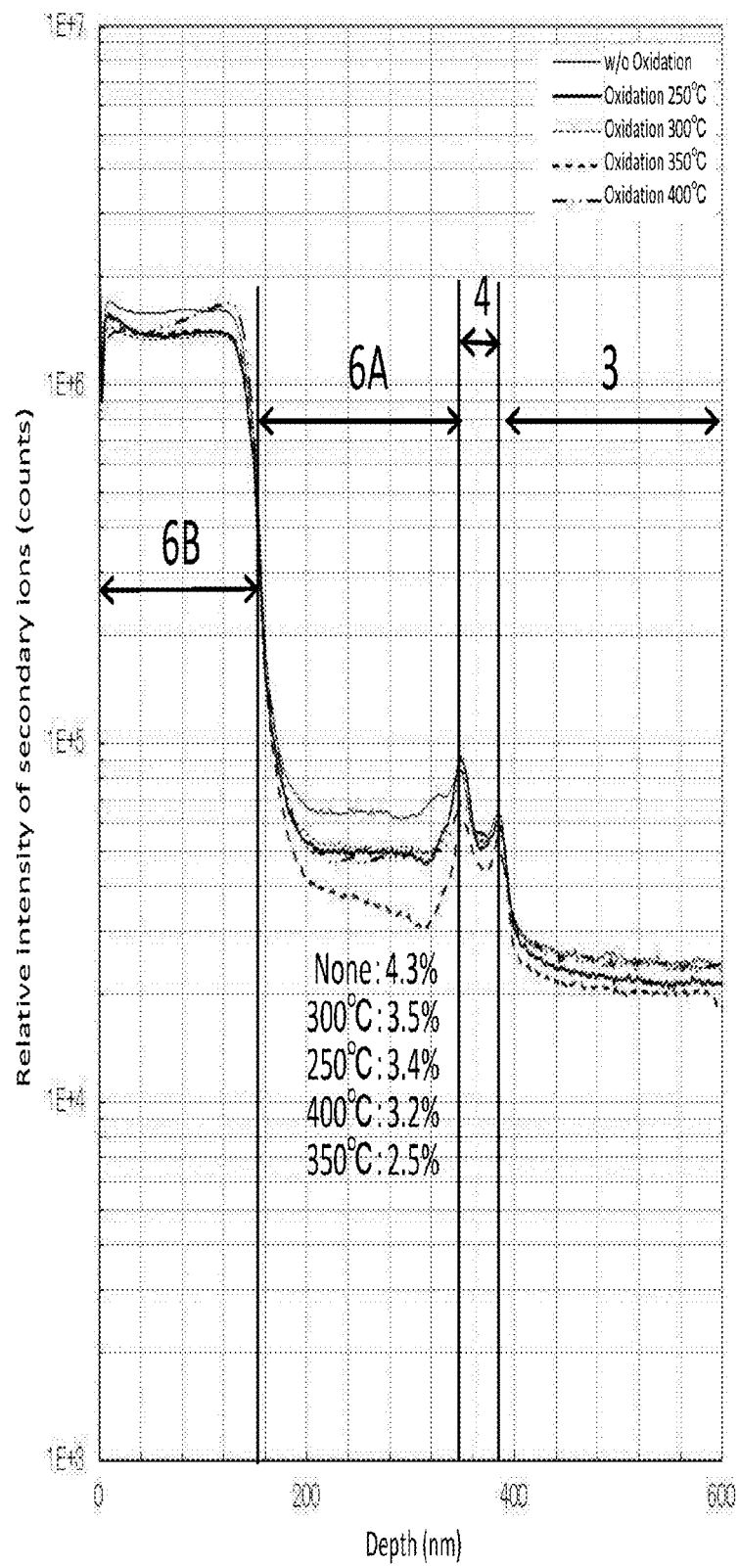
FIG. 17 indicates relative intensity of secondary hydrogen ions in the depth direction from a second protective film to a gate insulating film in an embodiment.

Further, relative intensity of secondary hydrogen ions was measured in depth direction from the opposite surface from the side to the first protective film (the outer most surface) of the second protective film to the gate insulator film of the TFT device used for the measurement of specific resistance by using secondary ion mass spectroscopy (SIMS). In order to investigate hydrogen concentration in the first protective film ($SiO_x$ film) not being subjected to a heat treatment in a quantitative manner, elastic recoil detection analysis (ERDA) was also carried out for a $SiO_x$ film prepared under the same conditions as the TFT. The hydrogen concentration was found 4.3 atomic %. From the hydrogen concentration in the first protective $SiO_x$ film which has not been subjected to a heat treatment and the relative intensities of secondary hydrogen ions of the samples which have been subjected to heat treatments at various temperatures, respective hydrogen concentration was estimated in the first protective $SiO_x$ film which has been subjected to the heat treatments at various temperatures. The result is illustrated in FIG. 17. In order from the left side, 6B is a single layer of $SiN_x$ formed as the second protective film, 6A is a $SiO_x$ film formed as the first protective film, 4 is an oxide semiconductor layer, and 3 is a gate insulator film in FIG. 17.

The results illustrated in FIG. 15 and FIG. 16 may be summarized as follows. Firstly, the S values, indicated in filled triangle in FIG. 15, of 0.45 V/dec or lower were attained when the heating temperatures were 250° C. and 300° C. It was also elucidated in FIG. 15 that the specific resistance of the oxide semiconductor layer, indicated by filled circles, were preferably larger than or equal to $2.1 \times 10^2$ $\Omega$-cm and smaller than or equal to $4.0 \times 10^4$ $\Omega$-cm in order to attain the S value of 0.45 V or lower. The preferable range is indicated by broken lines and vertical arrows in FIG. 15. The specific resistance is more preferably smaller than or equal to $1.0 \times 10^4$ $\Omega$-cm. It is noted here that small S values may be attained by selecting the source-drain materials even when the heating temperature was about 400° C. although the specific resistance was increased when the heating temperatures were 350° C. or higher in FIG. 15.

Specific resistance increased with the heating temperature, and then decreased with the heating temperature of higher than 400° C. as indicated by filled circles in FIG. 15. The specific resistance was ordinary increased with the heating temperature as oxidation of the oxide semiconductor layer was enhanced. However, when the heating temperature was higher than 400° C., for example 500° C. as indicated in FIG. 15, a phenomenon other than oxidation, such as formation of microcrystals in the oxide semiconductor layer, was supposed to became dominant.

Regarding $\Delta V_{th}$ indicated by filled square in FIG. 16, it was observed that $\Delta V_{th}$ of 4.50 V or smaller when the heat treatment temperatures were 250° C., 300° C., and 350° C. It was further found that the specific resistance of the oxide semiconductor layer indicated by filled circle was preferably larger than or equal to $2.1 \times 10^2$ $\Omega$-cm and smaller than or equal to $1.6 \times 10^5$ $\Omega$-cm in order to realize $\Delta V_{th}$ of 4.50 V or smaller. The preferable range is indicated by broken lines and vertical arrows in FIG. 16. The specific resistance was preferably smaller than or equal to $1.2 \times 10^5$ $\Omega$-cm, and more preferably smaller than or equal to $1.0 \times 10^5$ $\Omega$-cm.

It was thus elucidated from the results illustrated in FIG. 15 and FIG. 16 that specific resistance of the oxide semiconductor film was preferably controlled to a range of larger than or equal to $2.1 \times 10^2$ $\Omega$-cm and smaller than or equal to $1.0 \times 10^5$ $\Omega$-cm in order to achieve $\Delta V_{th}$ (in absolute value) of smaller than or equal to 4.50 V. As explained above, the S value of 0.45 V/dec or lower may be realized by controlling the specific resistance to larger than or equal to $2.1 \times 10^2$ $\Omega$-cm. In order to secure the S value of 0.45 V/dec or lower, it was found that the specific resistance was more preferably equal to or lower than $4.0 \times 10^4$ $\Omega$-cm. It was also found that the heat treatment temperature was preferably higher than or equal to 250° C. and lower than or equal to 300° C. to secure the S value of 0.45 V/dec or smaller.

The respective hydrogen concentration was found decreased to 3.5 atomic % or smaller in the $SiO_x$ film which was subjected to the oxidation treatment while the hydrogen concentration was 4.3 atomic % in the $SiO_x$ film which was not subjected to the oxidation treatment in FIG. 17. Considering the results combined with those indicated in FIG. 15 and FIG. 16, it was found necessary to control the hydrogen concentration in the $SiO_x$ film to 3.5 atomic % or smaller by performing the oxidation treatment for the first protective film in order to satisfy both conditions of the static characteristics of 0.45 V/dec or smaller and the stress stability represented by $\Delta V_{th}$ (in absolute value) of 4.50 V or smaller.

The present application has been explained in detail by referring to specific embodiment in the above. It is obvious for a person skilled in the art that various modifications and corrections can be made within the scope and the spirit of the present invention. The present application claims the benefit of priority based on Japanese Patent Applications No. 2013-137294 and No. 2014-082143 filed on Jun. 28, 2013 and Apr. 11, 2014, respectively. The entire contents of the files are incorporated herein by reference.

EXPLANATION OF REFERENCE NUMERALS

1 Substrate
2 Gate electrode
3 Gate insulator film
4 Oxide semiconductor layer
5 Source-drain (S/D) electrode
6 Passivation film (insulating film)
6A First protective film ($SiO_{x\ film}$)
6B Second protective film
7 Contact hole
8 Transparent conductive film
9 Etch stopper layer
12 Si substrate
13 Evaporated carbon film
14 Mo oxide

The invention claimed is:
1. A thin film transistor comprising, in order;
a gate electrode,
a gate insulator film,
an oxide semiconductor layer,
a source-drain electrode, and
a passivation film comprising more than one layer on a substrate,
wherein
the oxide semiconductor layer comprises O, Sn, In, Ga, and Zn wherein the amount of In, Ga, Zn, and Sn relative to the total amount of In, Ga, Zn, and Sn is:
15 atomic %≤In≤25 atomic %,
5 atomic %≤Ga≤20 atomic %,
40 atomic %≤Zn≤60 atomic %, and
9 atomic %≤Sn≤25 atomic %;
the passivation film comprises a first protective film in contact to the oxide semiconductor layer and a second protective film comprising one or more layers other than the first protective film;
the first protective film is a $SiO_x$ film; and
the hydrogen concentration in the first protective film is 3.5 atomic % or lower.
2. The thin film transistor of claim 1, wherein
the second protective film is an insulating compound film or a laminate film comprising a resin film and the insulating compound film.
3. The thin film transistor of claim 2, wherein
the insulating compound film is an oxide, a nitride, or an oxynitride film comprising one or more elements selected from the group consisting of Si, Al, Ti, Ta, Ce, Ga, Hf, Nb, V, W, Y, and Zr.
4. The thin film transistor of claim 3, wherein
the insulating compound film comprises $SiN_x$ film and an oxide film comprising one or more elements selected from the group consisting of Si, Al, Ti, Ta, Ce, Nb, V, W, Y, and Zr.
5. The thin film transistor of claim 2, wherein
the thickness of the first protective film is larger than or equal to 30 nm.
6. The thin film transistor of claim 1, wherein the amount of In relative to the total amount of In, Ga, Zn, and Sn is 16 atomic % to 23 atomic %.
7. The thin film transistor of claim 1, wherein the amount of Ga relative to the total amount of In, Ga, Zn, and Sn is 10 atomic % to 19 atomic %.
8. The thin film transistor of claim 1, wherein the amount of Zn relative to the total amount of in, Ga, Zn, and Sn is 43 atomic % to 60 atomic %.
9. The thin film transistor claim 1, wherein the amount of Zn relative to the total amount of In, Ga, Zn, and Sn is 43 atomic % to 50 atomic %.
10. The thin film transistor of claim 1, wherein
the specific resistance of the oxide semiconductor layer is $2.1 \times 10^2$ Ω-cm or larger and $1.0 \times 10^5$ Ω-cm or smaller.
11. The thin film transistor of claim 1, wherein
the oxide semiconductor layer comprises Sn in an amount of 15 atomic % to 25 atomic % relative to the total amount of metal elements in the oxide semiconductor layer.
12. The thin film transistor of claim 1, wherein
the amount of In, Ga, Zn, and Sn relative to the total amount of In, Ga, Zn, and Sn is:
16 atomic %≤In≤23 atomic %,
10 atomic %≤Ga≤19 atomic %,
43 atomic %≤Zn≤60 atomic %, and
15 atomic %≤Sn≤25 atomic %.
13. The thin film transistor of claim 1, wherein
the thickness of the first protective film is larger than or equal to 30 nm.
14. The thin film transistor as set forth in claim 1 wherein
the source-drain electrode comprises a pure Mo film, a Mo alloy film, or both.
15. The thin film transistor of claim 1, wherein the source-drain electrode is a laminate film comprising;
one or more films selected from a pure Mo film and a Mo alloy film, and are in direct contact to the oxide semiconductor layer; and
one or more films selected from the group consisting of a pure Al film, a pure Cu film, an Al alloy film, and a Cu alloy film.
16. Method of manufacturing the thin film transistor of claim 1 comprising:
forming the gate electrode on the substrate;
forming the gate insulator film on the gate electrode;
forming the oxide semiconductor layer on the gate insulator film wherein the oxide semiconductor layer comprises O, Sn, In, Ga and Zn, the amounts of In, Ga, Zn, and Sn relative to the total amount of In, Ga, Zn, and Sn are: 15 atomic %≤In ≤25 atomic %, 5 atomic %≤Ga ≤20 atomic %, 40 atomic %≤Zn≤60 atomic %, and 9 atomic %≤Sn≤25 atomic %;
forming the source-drain electrode on the oxide semiconductor layer comprising carrying out patterning of the source-drain electrode with an acid-based etchant; and
forming the passivation film on the source-drain electrode wherein the passivation film comprises the first protective film in contact to the oxide semiconductor layer and the second protective film comprising one or more layers other than the first protective film, the first protective film is the $SiO_x$ film and the hydrogen concentration in the first protective film is 3.5 atomic % or lower, wherein forming the passivation film comprises carrying out an oxidation treatment after forming the $SiO_x$ as the first protective film and forming the second protective film on the first protective film.
17. The method of claim 16, wherein
the oxidation treatment is a heat treatment conducted at a temperature of higher than or equal to 130° C. and lower than or equal to 400° C.
18. The method of claim 16 further comprising;
carrying out a heat treatment after the forming of the second protective film.

19. The method of claim 17, further comprising:
carrying out a heat treatment after the forming of the second protective film.

\* \* \* \* \*